US012283462B2

(12) United States Patent
Mopidevi et al.

(10) Patent No.: US 12,283,462 B2
(45) Date of Patent: Apr. 22, 2025

(54) CONTROL OF PLASMA FORMATION BY RF COUPLING STRUCTURES

(71) Applicant: Lam Research Corporation, Fremont, CA (US)

(72) Inventors: Hema Swaroop Mopidevi, Georgetown, TX (US); Lee Chen, Cedar Creek, TX (US); Thomas W. Anderson, Hayward, CA (US); Shaun Tyler Smith, Portland, OR (US); Neil M. P. Benjamin, Palo Alto, CA (US)

(73) Assignee: Lam Research Corporation, Fremont, CA (US)

( * ) Notice: Subject to any disclaimer, the term of this patent is extended or adjusted under 35 U.S.C. 154(b) by 81 days.

(21) Appl. No.: 18/000,895

(22) PCT Filed: Jun. 7, 2021

(86) PCT No.: PCT/US2021/036163
§ 371 (c)(1),
(2) Date: Dec. 6, 2022

(87) PCT Pub. No.: WO2021/252353
PCT Pub. Date: Dec. 16, 2021

(65) Prior Publication Data
US 2023/0326720 A1 Oct. 12, 2023

Related U.S. Application Data

(60) Provisional application No. 62/705,137, filed on Jun. 12, 2020.

(51) Int. Cl.
*H01J 37/32* (2006.01)
(52) U.S. Cl.
CPC ...... *H01J 37/32174* (2013.01); *H01J 37/321* (2013.01)

(58) Field of Classification Search
None
See application file for complete search history.

(56) References Cited

U.S. PATENT DOCUMENTS

| 3,995,237 A | 11/1976 | Brunner |
| 4,044,357 A | 8/1977 | Goldie |
| (Continued) | | |

FOREIGN PATENT DOCUMENTS

| CN | 1233147 A | 10/1999 |
| CN | 1619767 A | 5/2005 |
| (Continued) | | |

OTHER PUBLICATIONS

Chinese First Office Action dated Aug. 27, 2015 issued in Application No. CN201310467492.0.
(Continued)

*Primary Examiner* — Srinivas Sathiraju
(74) *Attorney, Agent, or Firm* — Weaver Austin Villeneuve & Sampson LLP

(57) ABSTRACT

An apparatus for forming a plasma may include one or more coupling ports to accept a radiofrequency (RF) current. The apparatus may additionally include one or more coupling structures which may include one or more conductive loops to permit the RF current to conduct from at least a first portion of the one or more coupling ports to at least a second port of the one or more coupling ports. The one or more conductive loops may each be configured to exhibit a first value of inductance in the absence of the plasma and to exhibit a second value of inductance in the presence of the plasma. The one or more coupling structures may each include a reactive element, in which each reactive element is coupled to a corresponding one of the one or more conductive loops so as to form a corresponding number of coupling structures. Each RF coupling structure may have a
(Continued)

resonant frequency that increases in response to the presence of the plasma.

31 Claims, 9 Drawing Sheets

(56) References Cited

U.S. PATENT DOCUMENTS

| | | | |
|---|---|---|---|
| 5,155,547 A | 10/1992 | Casper et al. | |
| 5,195,045 A | 3/1993 | Keane et al. | |
| 5,314,603 A | 5/1994 | Sugiyama et al. | |
| 5,369,795 A | 11/1994 | Yanagimoto | |
| 5,499,384 A | 3/1996 | Lentz et al. | |
| 5,572,170 A | 11/1996 | Collins et al. | |
| 5,580,385 A | 12/1996 | Paranjpe et al. | |
| 5,643,364 A | 7/1997 | Zhao et al. | |
| 5,770,922 A | 6/1998 | Gerrish et al. | |
| 5,866,985 A | 2/1999 | Coultas et al. | |
| 5,897,713 A | 4/1999 | Tomioka et al. | |
| 6,020,794 A | 2/2000 | Wilbur | |
| 6,028,014 A | 2/2000 | Sukjarev | |
| 6,054,013 A | 4/2000 | Collins et al. | |
| 6,068,784 A | 5/2000 | Collins et al. | |
| 6,239,587 B1 | 5/2001 | Buck | |
| 6,251,792 B1 | 6/2001 | Collins et al. | |
| 6,288,493 B1 | 9/2001 | Lee et al. | |
| 6,388,226 B1 | 5/2002 | Smith et al. | |
| 6,444,137 B1 | 9/2002 | Collins et al. | |
| 6,447,636 B1 | 9/2002 | Qian et al. | |
| 6,518,195 B1 | 2/2003 | Collins et al. | |
| 6,815,633 B1 | 11/2004 | Chen et al. | |
| 6,887,339 B1 | 5/2005 | Goodman et al. | |
| 6,922,324 B1 | 7/2005 | Horwitz | |
| 6,939,434 B2 | 9/2005 | Collins et al. | |
| 7,042,311 B1 | 5/2006 | Hilliker et al. | |
| 7,777,152 B2 | 8/2010 | Todorov et al. | |
| 8,179,050 B2 | 5/2012 | Chen | |
| 8,190,380 B2 | 5/2012 | Choueiry et al. | |
| 8,368,308 B2 | 2/2013 | Banna et al. | |
| 8,617,351 B2 | 12/2013 | Hoffman et al. | |
| 9,082,589 B2 | 7/2015 | Thomas et al. | |
| 9,518,554 B2 | 12/2016 | Mongin et al. | |
| 9,526,161 B2 | 12/2016 | Habu | |
| 9,596,744 B2 * | 3/2017 | Leeser | H05H 1/46 |
| 9,704,692 B2 * | 7/2017 | Leeser | G01R 29/08 |
| 9,773,643 B1 | 9/2017 | Singhal et al. | |
| 9,779,196 B2 | 10/2017 | Valcore, Jr. et al. | |
| 9,859,088 B2 * | 1/2018 | Shaikh | H01J 37/32935 |
| 9,918,376 B2 | 3/2018 | Thomas et al. | |
| 10,224,184 B2 | 3/2019 | Van Zyl | |
| 10,354,838 B1 * | 7/2019 | Mopidevi | H01L 21/67069 |
| 10,388,485 B2 * | 8/2019 | Shaikh | C23C 16/45587 |
| 10,553,465 B2 * | 2/2020 | Augustyniak | H01J 37/32385 |
| 10,950,421 B2 | 3/2021 | Valcore, Jr. | |
| 11,527,385 B2 | 12/2022 | Maw et al. | |
| 11,756,768 B2 | 9/2023 | Hasegawa et al. | |
| 11,984,298 B2 | 5/2024 | Juco et al. | |
| 11,994,542 B2 | 5/2024 | Kapoor et al. | |
| 12,136,938 B2 | 11/2024 | Juco et al. | |
| 2001/0042594 A1 | 11/2001 | Shamouilian et al. | |
| 2001/0054383 A1 | 12/2001 | Pu et al. | |
| 2002/0023899 A1 | 2/2002 | Khater et al. | |
| 2002/0038688 A1 * | 4/2002 | Nakano | H01J 37/32165 |
| | | | 156/345.12 |
| 2002/0180534 A1 | 12/2002 | Bohn et al. | |
| 2003/0141821 A1 * | 7/2003 | Nakano | H01J 37/32183 |
| | | | 315/111.21 |
| 2003/0146803 A1 | 8/2003 | Pickard et al. | |
| 2003/0157812 A1 | 8/2003 | Narwankar et al. | |
| 2004/0032212 A1 | 2/2004 | Yuzurihara et al. | |
| 2004/0195972 A1 | 10/2004 | Cornelius | |
| 2005/0001556 A1 | 1/2005 | Hoffman et al. | |
| 2005/0069651 A1 | 3/2005 | Miyoshi et al. | |
| 2005/0106873 A1 | 5/2005 | Hoffman et al. | |
| 2005/0134186 A1 | 6/2005 | Brouk et al. | |
| 2005/0205532 A1 | 9/2005 | Patrick et al. | |
| 2006/0116106 A1 | 6/2006 | Turner | |
| 2007/0153780 A1 | 7/2007 | Stanley | |
| 2007/0251920 A1 | 11/2007 | Hoffman | |
| 2008/0106206 A1 | 5/2008 | Hooke et al. | |
| 2008/0179948 A1 | 7/2008 | Nagarkatti et al. | |
| 2009/0037999 A1 * | 2/2009 | Anderson | H04W 28/16 |
| | | | 726/12 |
| 2009/0278512 A1 | 11/2009 | Karlicek et al. | |
| 2009/0289630 A1 | 11/2009 | Nascimento et al. | |
| 2010/0025384 A1 | 2/2010 | Todorow et al. | |
| 2010/0171427 A1 | 7/2010 | Kirchmeier et al. | |
| 2010/0276391 A1 * | 11/2010 | Grimbergen | H01J 37/32174 |
| | | | 216/41 |
| 2011/0063042 A1 | 3/2011 | Mendolia et al. | |
| 2011/0101862 A1 | 5/2011 | Koo et al. | |
| 2011/0140607 A1 | 6/2011 | Moore et al. | |
| 2011/0148303 A1 | 6/2011 | Van Zyl et al. | |
| 2011/0214811 A1 | 9/2011 | Ashida | |
| 2012/0074844 A1 | 3/2012 | York et al. | |
| 2012/0212135 A1 | 8/2012 | Suzuki | |
| 2012/0247679 A1 | 10/2012 | Yamazawa | |
| 2012/0298303 A1 | 11/2012 | Ikeda et al. | |
| 2013/0105082 A1 | 5/2013 | Melikyan et al. | |
| 2013/0234741 A1 | 9/2013 | Mow et al. | |
| 2014/0008357 A1 | 1/2014 | Cheng et al. | |
| 2014/0062303 A1 | 3/2014 | Hoffman et al. | |
| 2014/0087668 A1 | 3/2014 | Mow et al. | |
| 2014/0097751 A1 | 4/2014 | Thomas et al. | |
| 2014/0155008 A1 | 6/2014 | Van Zyl | |
| 2014/0231389 A1 | 8/2014 | Nagami et al. | |
| 2014/0367043 A1 * | 12/2014 | Bishara | H01J 37/32165 |
| | | | 315/111.21 |
| 2015/0037972 A1 * | 2/2015 | Danek | H01L 21/76814 |
| | | | 438/618 |
| 2015/0221478 A1 | 8/2015 | Himori et al. | |
| 2015/0255994 A1 * | 9/2015 | Kesler | B60L 53/124 |
| | | | 307/10.1 |
| 2015/0313000 A1 | 10/2015 | Thomas et al. | |
| 2015/0340204 A1 | 11/2015 | Kudela et al. | |
| 2015/0348854 A1 | 12/2015 | Kapoor et al. | |
| 2015/0371876 A1 | 12/2015 | Terauchi et al. | |
| 2016/0065207 A1 | 3/2016 | Bhutta | |
| 2016/0087687 A1 * | 3/2016 | Kesler | H02J 50/80 |
| | | | 307/104 |
| 2016/0113103 A1 | 4/2016 | Van Zyl | |
| 2016/0295677 A1 * | 10/2016 | Leeser | H05H 1/46 |
| 2016/0322215 A1 * | 11/2016 | Shaikh | C23C 16/505 |
| 2017/0004955 A1 * | 1/2017 | Leeser | H01J 37/321 |
| 2017/0062187 A1 | 3/2017 | Radomski et al. | |
| 2017/0117869 A1 | 4/2017 | Leeser et al. | |
| 2017/0236693 A1 | 8/2017 | Kobayashi et al. | |
| 2017/0244582 A1 | 8/2017 | Gal et al. | |
| 2017/0256416 A1 * | 9/2017 | Fischer | H01L 21/30655 |
| 2017/0330732 A1 | 11/2017 | Valcore, Jr. et al. | |
| 2017/0330744 A1 | 11/2017 | Keil et al. | |
| 2017/0345620 A1 | 11/2017 | Coumou et al. | |
| 2017/0365907 A1 | 12/2017 | Kapoor et al. | |
| 2017/0372870 A1 | 12/2017 | Godyak et al. | |
| 2018/0023158 A1 | 1/2018 | Sasaki et al. | |
| 2018/0025930 A1 * | 1/2018 | Augustyniak | H01L 21/68771 |
| | | | 438/798 |
| 2018/0068834 A1 | 3/2018 | Valcore, Jr. et al. | |
| 2018/0097520 A1 | 4/2018 | Wu | |
| 2018/0144903 A1 * | 5/2018 | Shaikh | H01J 37/32935 |
| 2018/0163302 A1 | 6/2018 | Kapoor et al. | |
| 2018/0231587 A1 | 8/2018 | Ye et al. | |
| 2018/0261431 A1 | 9/2018 | Hammond, IV et al. | |
| 2018/0308663 A1 | 10/2018 | Collins et al. | |
| 2018/0308664 A1 * | 10/2018 | Collins | H01J 37/32715 |
| 2018/0351322 A1 | 12/2018 | Kurosawa et al. | |
| 2018/0366378 A1 | 12/2018 | Kim et al. | |
| 2019/0049534 A1 | 2/2019 | Guan | |
| 2019/0051496 A1 * | 2/2019 | Collins | H01J 37/32165 |
| 2019/0068158 A1 | 2/2019 | Coumou et al. | |
| 2019/0108979 A1 | 4/2019 | Higuchi | |
| 2019/0149119 A1 | 5/2019 | Kapoor et al. | |
| 2019/0198345 A1 * | 6/2019 | Fischer | C23F 1/00 |
| 2019/0228950 A1 * | 7/2019 | Funk | H01J 37/32954 |

(56) References Cited

U.S. PATENT DOCUMENTS

| | | | |
|---|---|---|---|
| 2019/0288737 | A1 | 9/2019 | Hanks et al. |
| 2019/0391547 | A1* | 12/2019 | Coumou ............ H01J 37/32165 |
| 2020/0010957 | A1 | 1/2020 | Chen et al. |
| 2020/0118792 | A1* | 4/2020 | Mopidevi ......... H01L 21/67069 |
| 2020/0118856 | A1* | 4/2020 | Augustyniak ..... H01L 21/68771 |
| 2020/0126762 | A1 | 4/2020 | Yang et al. |
| 2020/0333434 | A1 | 10/2020 | Chancey et al. |
| 2020/0411286 | A1* | 12/2020 | Koshimizu ....... H01J 37/32697 |
| 2021/0183619 | A1* | 6/2021 | Patrick ..................... H01Q 1/36 |
| 2021/0302478 | A1 | 9/2021 | Kapoor et al. |
| 2021/0313948 | A1 | 10/2021 | Leeser et al. |
| 2022/0190854 | A1 | 6/2022 | Juco et al. |
| 2022/0328236 | A1 | 10/2022 | Kapoor |
| 2022/0344129 | A1 | 10/2022 | Kapoor |
| 2022/0375721 | A1 | 11/2022 | Fields et al. |
| 2022/0415616 | A1 | 12/2022 | Juco et al. |
| 2023/0052543 | A1 | 2/2023 | Linebarger, Jr. et al. |
| 2023/0223238 | A1 | 7/2023 | Guo et al. |
| 2023/0326720 | A1* | 10/2023 | Mopidevi ............. H01J 37/321 |
| | | | 315/111.21 |
| 2024/0203711 | A1 | 6/2024 | Kapoor et al. |
| 2024/0258073 | A1 | 8/2024 | Juco et al. |
| 2024/0272210 | A1 | 8/2024 | Kapoor et al. |

FOREIGN PATENT DOCUMENTS

| | | | |
|---|---|---|---|
| CN | 1656593 | A | 8/2005 |
| CN | 1925322 | A | 3/2007 |
| CN | 101630624 | A | 1/2010 |
| CN | 101866808 | A | 10/2010 |
| CN | 101933225 | A | 12/2010 |
| CN | 102037789 | A | 4/2011 |
| CN | 103533690 | A | 1/2014 |
| CN | 105321792 | A | 2/2016 |
| CN | 107419238 | A | 12/2017 |
| CN | 108109897 | A | 6/2018 |
| CN | 109659215 | A | 4/2019 |
| EP | 0840350 | A2 | 5/1998 |
| EP | 0935406 | A2 | 8/1999 |
| EP | 0731559 | B1 | 11/2001 |
| EP | 2881579 | A1 | 6/2015 |
| EP | 2881579 | B1 | 3/2019 |
| GB | 1599557 | A | 10/1981 |
| JP | H0589997 | A | 4/1993 |
| JP | H08274067 | A | 10/1996 |
| JP | H11233294 | A | 8/1999 |
| JP | 2001057360 | A | 2/2001 |
| JP | 2003302431 | A | 10/2003 |
| JP | 2004031566 | A | 1/2004 |
| JP | 2005527078 | A | 9/2005 |
| JP | 2006019716 | A | 1/2006 |
| JP | 2006286814 | A | 10/2006 |
| JP | 4352562 | B2 | 10/2009 |
| JP | 2010065240 | A | 3/2010 |
| JP | 2011515790 | A | 5/2011 |
| JP | 2011135766 | A | 7/2011 |
| JP | 2011222292 | A | 11/2011 |
| JP | 2014099585 | A | 5/2014 |
| JP | 2014142266 | A | 8/2014 |
| JP | 2014186994 | A | 10/2014 |
| JP | 2016009733 | A | 1/2016 |
| JP | 2017143057 | A | 8/2017 |
| JP | 2017199904 | A | 11/2017 |
| JP | 2018011050 | A | 1/2018 |
| JP | 2018022685 | A | 2/2018 |
| JP | 2019504481 | A | 2/2019 |
| JP | 2019071270 | A | 5/2019 |
| JP | 2019517125 | A | 6/2019 |
| JP | 2019133785 | A | 8/2019 |
| JP | 2020510959 | A | 4/2020 |
| JP | 2021052062 | A | 4/2021 |
| KR | 980012069 | A | 4/1998 |
| KR | 20010015590 | A | 2/2001 |
| KR | 20040084477 | A | 10/2004 |
| KR | 20050029122 | A | 3/2005 |
| KR | 20070101654 | A | 10/2007 |
| KR | 20070109275 | A | 11/2007 |
| KR | 20110116939 | A | 10/2011 |
| KR | 20130047532 | A | 5/2013 |
| KR | 20140104380 | A | 8/2014 |
| KR | 20160000400 | A | 1/2016 |
| KR | 20170054239 | A | 5/2017 |
| KR | 101791706 | B1 | 10/2017 |
| KR | 20170114800 | A | 10/2017 |
| KR | 20180080631 | A | 7/2018 |
| KR | 20180082626 | A | 7/2018 |
| KR | 20190047404 | A | 5/2019 |
| KR | 20190109559 | A | 9/2019 |
| KR | 20200003561 | A | 1/2020 |
| KR | 20200111233 | A | 9/2020 |
| KR | 102505150 | B1 | 2/2023 |
| TW | 200509194 | A | 3/2005 |
| TW | I290331 | B | 11/2007 |
| TW | 201141317 | A | 11/2011 |
| TW | 201611153 | A | 3/2016 |
| TW | 201840989 | A | 11/2018 |
| TW | 201903818 | A | 1/2019 |
| TW | 201935596 | A | 9/2019 |
| WO | WO-9534945 | A2 | 12/1995 |
| WO | WO-9914855 | A1 | 3/1999 |
| WO | WO-02080220 | A1 | 10/2002 |
| WO | WO-03101160 | A2 | 12/2003 |
| WO | WO-2005031839 | A1 | 4/2005 |
| WO | WO-2009099486 | A1 | 8/2009 |
| WO | WO-2011028600 | A2 | 3/2011 |
| WO | WO-2017100136 | A1 | 6/2017 |
| WO | WO-2018156486 | A1 | 8/2018 |
| WO | WO-2018228133 | A1 | 12/2018 |
| WO | WO-2019079325 | A1 | 4/2019 |
| WO | WO-2019165296 | A1 | 8/2019 |

OTHER PUBLICATIONS

Chinese First Office Action dated May 17, 2017 issued in Application No. CN 201610428220.3.
Chinese Second Office Action dated Mar. 5, 2018 issued in Application No. CN201610428220.3.
Chinese Third Office Action dated Aug. 15, 2018 issued in Application No. CN201610428220.3.
Final Office Action dated Jul. 7, 2017 issued in U.S. Appl. No. 14/737,377.
International Preliminary Report on Patentability and written opinion dated Aug. 25, 2022 in Application PCT/US2021/017227.
International Preliminary Report on Patentability and written opinion dated Nov. 17, 2022 in Application PCT/US2021/030177.
International Preliminary Report on Patentability dated Apr. 14, 2022 from PCT/US2020/053014.
International Preliminary Report on Patentability dated Dec. 22, 2022, in PCT Application No. PCT/US2021/036163.
International Preliminary Report on Patentability dated Feb. 10, 2022 issued in Application No. PCT/US2020/070333.
International Preliminary Report on Patentability dated Jun. 16, 2022, in PCT Application No. PCT/US2020/062924.
International Preliminary Report on Patentability dated Nov. 18, 2021, issued inPCT/US2020/030835.
International Preliminary Report on Patentability dated Oct. 6, 2022 in PCT Application PCT/US2021/023942.
International Search Report and Written Opinion dated Apr. 7, 2021 issued in Application No. PCT/US2020/062924.
International Search Report and Written Opinion dated Aug. 17, 2021 issued in Application No. PCT/US2021/030177.
International Search Report and Written Opinion dated Aug. 21, 2020 issued in Application No. PCT/US2020/030835.
International Search Report and Written Opinion dated Dec. 16, 2022 in PCT Application No. PCT/US2022/030252.
International Search Report and Written Opinion dated Feb. 3, 2021 issued in Application No. PCT/US2020/057020.
International Search Report and Written Opinion dated Jan. 19, 2021, for International Application No. PCT/US2020/053014.

(56) References Cited

OTHER PUBLICATIONS

International Search Report and Written Opinion dated Jul. 15, 2021 issued in Application No. PCT/US2021/023942.
International Search Report and Written Opinion dated Jun. 4, 2021 issued in Application No. PCT/US2021/017227.
International Search Report and Written Opinion dated Nov. 11, 2020 issued in Application No. PCT/US2020/070333.
International Search Report and Written Opinion dated Sep. 27, 2021 issued in Application No. PCT/US2021/036163.
Korean Decision for Grant of Patent dated Jan. 18, 2020 issued in Application No. KR 10-2013-0120518.
KR Office Action dated Aug. 4, 2022 in Application No. KR10-2022-7013719 With English translation.
KR Office Action dated Feb. 24, 2022 in Application No. KR10-2022-7025826.
KR Office Action dated Sep. 21, 2022 in Application No. KR10-2022-7025826 with English translation.
Notice of Allowance dated Mar. 31, 2015 issued in U.S. Appl. No. 13/648,183.
Notice of Allowance dated Oct. 31, 2017 issued in U.S. Appl. No. 14/737,377.
Office Action dated Sep. 23, 2016 issued in U.S. Appl. No. 14/737,377.
PCT International Preliminary Report on Patentability dated May 5, 2022 issued in PCT/US2020/057020.
Taiwanese Notice of Allowance dated Jan. 19, 2017 issued in Application No. TW 102136597.
U.S. Appl. No. 17/907,067, inventors Kapoor et al., filed on Sep. 22, 2022.
U.S. Appl. No. 17/997,802, inventor Guo et al., filed on Nov. 2, 2022.
Restriction Requirement dated Feb. 24, 2023 in U.S. Appl. No. 16/832,961.
CN Office Action dated Oct. 11, 2023, in application No. CN202080056165.4 with English translation.
CN Office Action dated Oct. 24, 2023, in application No. CN202080034447.4 with English translation.
International Preliminary Report on Patentability dated Jan. 12, 2023, in PCT Application No. PCT/US2021/038457.
International Search Report and Written Opinion dated Oct. 14, 2021, in application No. PCT/US2021/038457.
JP Notice of Allowances dated Sep. 3, 2024 in JP Application No. 2022-506171 with English translation.
JP Notice of Allowances dated Sep. 10, 2024 in JP Application No. 2022-530889 with English translation.
JP Office Action dated Apr. 30, 2024 in JP Application No. 2022-506171, with English Translation.
JP Office Action dated Aug. 27, 2024 in JP Application No. 2022-547225 with English translation.
JP Office Action dated Jun. 11, 2024 in JP Application No. 2022-530889 with English translation.
JP Office Action dated Jun. 18, 2024 in JP Application No. 2022-523827 with English Translation.
JP Office Action dated May 7, 2024 in JP Application No. 2021-564697, with English Translation.
KR Office Action dated Aug. 23, 2024 in KR Application No. 10-2023-7006703, with English Translation.
KR Office Action dated Feb. 24, 2023 in Application No. KR10-2022-7025826 with English translation.
KR Office Action dated Jan. 16, 2024 in KR Application No. 10-2023-7006703 with English translation.
KR Office Action dated May 21, 2024 in KR Application No. 10-2019-0071320, with English translation.
SG Search Report and Written Opinion dated Nov. 1, 2023 in SG Application No. 11202111969R.
SG Search Report and Written Opinion dated Nov. 15, 2023 in SG Application No. 11202202918X.
SG Search report dated Jul. 16, 2024 in Application No. SG11202205585V.
TW Office Action dated Apr. 3, 2024 in TW Application No. 109115006, with English Translation.
TW Office Action dated Aug. 2, 2024 in TW Application No. 109133629 with English translation.
TW Office Action dated May 9, 2024 in TW Application No. 109125947, with English Translation.
TW Office Action dated May 22, 2024 in TW Application No. 109136856, with English translation.
TW Office Action dated Sep. 23, 2024 in TW Application No. 110111059 with English translation.
Final Office Action dated Jun. 28, 2024 in U.S. Appl. No. 17/597,932.
Non-Final Office Action dated Dec. 21, 2023 in U.S. Appl. No. 17/594,906.
Non-Final Office Action dated Jul. 3, 2023, in U.S. Appl. No. 16/832,961.
Non-Final Office Action dated Mar. 8, 2024 in U.S. Appl. No. 17/597,932.
Notice of Allowance dated Feb. 6, 2024 in U.S. Appl. No. 16/832,961.
Notice of Allowance dated Jan. 12, 2024 in U.S. Appl. No. 17/756,058.
Notice of Allowance dated Jan. 23, 2024 in U.S. Appl. No. 17/756,058.
Notice of Allowance dated Jun. 20, 2024 in U.S. Appl. No. 17/594,906.
Notice of Allowance dated Oct. 20, 2023 in U.S. Appl. No. 16/832,961.
Notice of Allowance dated Sep. 18, 2024 in U.S. Appl. No. 17/597,932.
U.S. Appl. No. 18/847,308, inventors Dehghan S, et al., filed on Sep. 16, 2024.
U.S. Appl. No. 18/890,408, inventors Juco E.Y, et al., filed on Sep. 19, 2024.
Restriction Requirement dated Aug. 16, 2024 in U.S. Application No. 17/755,141.
Restriction requirement dated Aug. 23, 2024 in U.S. Appl. No. 17/907,067.
CN Office Action dated Oct. 31, 2024 in CN Application No. 202080074587.4 with English translation.
International Preliminary Report on Patentability and Written Opinion dated Oct. 3, 2024 in PCT Application No. PCT/US2022/030252.
JP Office Action dated Oct. 1, 2024 in JP Application No. 2022-520163 with English translation.
KR Notice of Allowance dated Nov. 28, 2024 in KR Application No. 10-2023-7006703, with English Translation.
TW Office Action dated Oct. 11, 2024 in TW Application No. 109115006 with English translation.
TW Office Action dated Oct. 11, 2024 in TW Application No. 109125947 with English translation.
Corrected Notice of Allowance dated Dec. 5, 2024 in U.S. Appl. No. 17/597,932.
Corrected Notice of Allowance dated Oct. 7, 2024 in U.S. Appl. No. 17/594,906.
Non-Final Office Action dated Nov. 13, 2024 in U.S. Appl. No. 18/631,368.
Restriction requirement dated Oct. 1, 2024 in U.S. Appl. No. 17/997,802.

\* cited by examiner $f_0$ = No Plasma Resonance Frequency
$f_{OP}$ = Operating Frequency $f_0$ = No-Plasma Resonant Frequency
$f_1$ = Plasma Resonant Frequency
$f_{OP}$ = Operating Frequency

CONTROL OF PLASMA FORMATION BY RF COUPLING STRUCTURES

CROSS REFERENCE

A PCT Request Form is filed concurrently with this specification as part of the present application. Each application that the present application claims benefit of or priority to as identified in the concurrently filed PCT Request Form is incorporated by reference herein in its entirety and for all purposes.

BACKGROUND

During wafer fabrication processes, such as deposition of a film on a substrate utilizing a multi-station integrated circuit fabrication chamber, one or more radiofrequency (RF) currents may be coupled into process stations of the chamber. Coupling of RF currents of sufficient energy into a process station may bring about or enhance formation of an ionized plasma material. The ionized plasma material may operate to form radical species of gaseous precursors to enable such precursors to be adsorbed, for example, by an exposed surface of a semiconductor wafer. Through a buildup of multiple layers, which may number into the hundreds or thousands, of very thin layers of material, an integrated circuit may be built on or over a semiconductor substrate. However, in some instances, formation of an ionized plasma material in a fabrication chamber may involve a delicate procedure in which certain parameters are rigidly controlled so as to bring about highly repeatable and consistent results. Thus, approaches toward improving control over various aspects of the formation of ionized plasma materials continues to be an active area of investigation.

The background description provided herein is for the purposes of generally presenting the context of the disclosure. Work of the presently named inventors, to the extent it is described in this background section, as well as aspects of the description that may not otherwise qualify as prior art at the time of filing, are neither expressly nor impliedly admitted as prior art against the present disclosure.

SUMMARY

One general aspect includes an apparatus for forming a plasma, including: one or more coupling ports to accept a radiofrequency (RF) current. The apparatus also includes one or more conductive loops configured to permit the RF current to conduct from at least a first port of the one or more coupling ports to at least a second port of the one or more coupling ports, the one or more conductive loops each configured to exhibit a second value of inductance in the presence of the plasma. The apparatus also includes one or more reactive elements, each coupled to a corresponding one of the one or more conductive loops, to form a corresponding number of coupling structures. Each coupling structure of the apparatus may have a resonant frequency configured to increase in response to the presence of the plasma.

In some embodiments, the one or more conductive loops of the apparatus are configured to form a plasma operating in an inductive mode. The one or more conductive loops of the apparatus can include two or more conductive loops. The one or more reactive elements can include one or more capacitive elements that cooperate with a corresponding conductive loop of the one or more conductive loops to bring about resonance at a frequency that is lower than the frequency of the RF current. The resonant frequency of the conductive loops can be a value that is within about 10% of the frequency of the RF current. The forming of the plasma can bring about a second value of inductance that is less than the first value of inductance. The coupling factor of the apparatus can be between a value of between about 0.35 and about 0.5. At least a portion of the formed plasma can be located in a region between segments of each of the one or more conductive loops. The formed plasma can be located in a region less than twice the separation distance between adjacent segments of each of the one or more conductive loops. At least one of the one or more conductive loops can include a hairpin shape. The apparatus can further include a delay network configured to maintain current conduction within the one or more conductive loops at a value that is at least twice the value of the current conducted to the first port of the one or more coupling ports. The delay network can be further configured to introduce a delay of about one-half wavelength between an output port of an RF matching network and the first port of the one or more coupling ports.

Another general aspect includes an apparatus that includes one or more input ports to receive an RF current. The apparatus can also include one or more conductive loops coupled to a corresponding one of the one or more input ports, each of the one or more conductive loops configured to exhibit inductance. The apparatus also includes one or more capacitive elements, each of the one or more capacitive elements coupled to a corresponding one of the one or more conductive loops so as to resonate at a first frequency that is below the frequency of the RF current. The apparatus can also include the conductive loops configured to convert a gas, proximate to the conductive loops, to a plasma in response to conduction of the RF current.

Embodiments can include an apparatus in which the first frequency differs from the frequency of the RF current by less than about 10%. The gas can at least partially surround the one or more conductive loops. The gas can be located within a distance of two times the spacing between adjacent segments of the one or more conductive loops. One or more conductive loops can be configured to resonate at a frequency below about 13.56 MHz. At least one of the one or more conductive loops can include a hairpin shape. The apparatus can further include a time-delay network configured to maintain peak current conduction within the one or more conductive loops at a value that is at least twice the value of the current conducted a first input port of the one or more input ports.

Another general aspect includes a multi-station integrated circuit fabrication chamber, including: a matching network to receive an RF current from an output port of an RF current generator. The multi-station integrated circuit fabrication chamber can also include one or more coupling structures to receive a current from the matching network, in which the one or more coupling structures includes at least one conductive loop and at least one capacitive element, and in which the one or more coupling structures are configured to resonate at a frequency that is less than the frequency of the RF current. The multi-station integrated circuit fabrication chamber can also include a volume configured to permit conversion of one or more gases to a plasma to conduct one or more fabrication operations within the multi-station integrated circuit fabrication chamber.

Embodiments may include the multi-station integrated circuit fabrication chamber having a time-delay network configured to maintain peak current conduction within the one or more conductive loops at a value that is at least twice the value of the current received from the matching network. In an embodiment, the fabrication chamber may include a time-delay network configured to introduce a delay of about one-half wavelength between an output port of the RF matching network and input ports of the one or more coupling structures. The gases within the multi-station integrated circuit fabrication chamber can at least partially surround the one or more conductive loops. At least a portion of the one or more gases can be located within a distance of two times the spacing between adjacent segments of the one or more conductive loops. A coupling factor between the one or more conductive loops and the formed plasma can include a value of between about 0.2 and about 0.5. The first frequency of the RF current and the resonant frequency of each of the one or more coupling structures can differ by less than about 10%. The one or more coupling structures can include three or more RF coupling structures.

Another general aspect includes an system for forming a that includes a radiofrequency (RF) current generator. The system also includes a first RF coupling structure configured to receive current generated by the RF current generator and to convert a gaseous material, at least partially surrounding the first RF coupling structure, to an ionized plasma. The first RF coupling structure is configured to exhibit an impedance that decreases responsive to an increased density of the ionized plasma. The RF current generator configured to decrease output current delivered to the first RF coupling structure responsive to the decreased impedance.

In an embodiment, the system can further include a second RF configured to receive current generated by the RF current generator and to convert a gaseous material, at least partially surrounding the second RF coupling structure to an ionized plasma. The system may also include an RF current divider having an input port coupled to an output port of the RF current generator and having a first output port coupled the first RF coupling structure and a second output port coupled to the second RF coupling structure, the second RF coupling structure configured to exhibit an impedance that decreases responsive to an increased density of the ionized plasma. In an embodiment, the current delivered to the first RF coupling may involve the use of an RF power divider in which the current delivered to the second RF coupling structure by the RF power divider are configured to be approximately equal during the increased density of the ionized plasma converted by the first RF coupling structure and during the increased density of the ionized plasma converted by the second RF coupling structure. The first RF coupling structure and the second RF coupling structure can include a conductive loop configured to form the ionized plasma in an H mode.

BRIEF DESCRIPTION OF THE DRAWINGS

The various embodiments disclosed herein are illustrated by way of example, and not by way of limitation, in the figures of the accompanying drawings, in which like reference numerals refer to similar elements.

DETAILED DESCRIPTION

Figure 1:
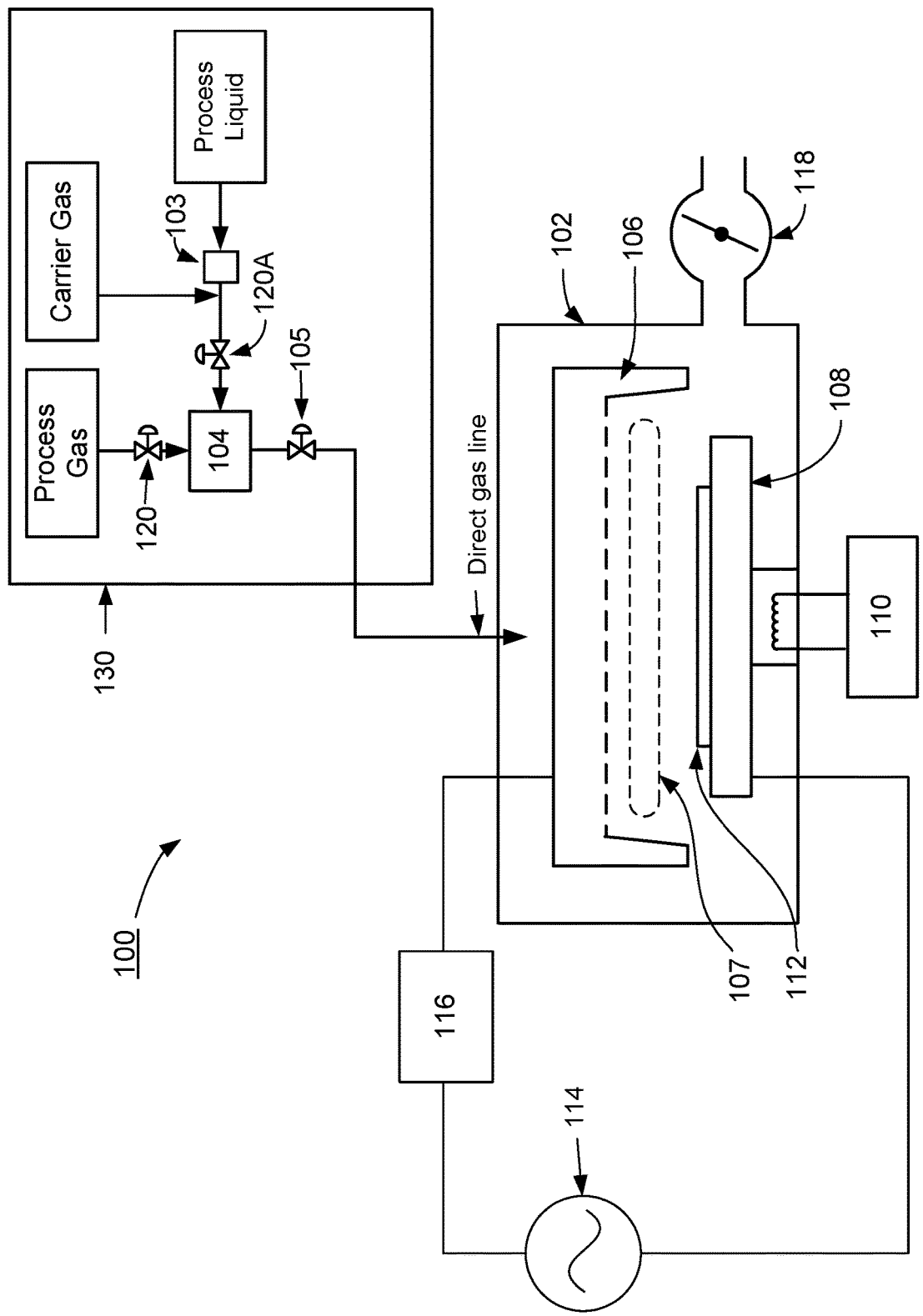
FIG. 1 shows an example apparatus for depositing or etching a film on or over a substrate utilizing any number of processes, according to an embodiment.

In certain types of integrated circuit fabrication chambers, a radiofrequency (RF) power source may be utilized to provide a signal having sufficient current and voltage to bring about formation of a plasma, which may include ionized gaseous compounds and/or elements, within the fabrication chamber. In some instances, RF energy may be coupled into a fabrication chamber utilizing an RF coupling structure, such as a conductive loop. In response to sufficient coupling of RF energy into a fabrication chamber, ionized gaseous materials within the chamber may react with one another to permit formation of one or more radicalized specie of precursor gases. When such radicalized specie of precursor gases are allowed to come into contact with a material present on a surface of a semiconductor substrate, deposition of a thin layer (e.g., a layer having a thickness comparable to that of a single atom or molecule) of a material at the surface of the semiconductor substrate may occur. After exposure of a substrate to an ionized plasma material, the fabrication chamber may be purged and a second gaseous material may be allowed to enter the fabrication chamber to bring about exposure of the semiconductor substrate to the second gaseous material. Following purging of the second gaseous precursor material from the fabrication chamber, ionized gaseous materials may again be introduced into the fabrication chamber, which may give rise to formation of an additional thin (e.g., atomic) layer of material. In certain instances, such processes may be repeated over hundreds or thousands of cycles (or an even greater number of cycles) until a film of a desired thickness has been formed or deposited on or over a semiconductor substrate.

However, formation of a plasma material for use in integrated circuit fabrication chambers utilizing an RF source may represent a delicate process. For instance, under certain circumstances, responsive to the presence of a discontinuity at an inner surface of a fabrication chamber, such as a slot valve, hole, or other type of orifice, RF current from the RF coupling structure may be disproportionately drawn toward the discontinuity. Such disproportionate drawing of RF energy in the direction of the discontinuity may give rise to a nonuniform formation of an ionized plasma material in which plasma may be formed with greater density at particular regions of a fabrication chamber in relation to other regions of the fabrication chamber. In some instances, variations in plasma density within the fabrication chamber may bring about nonuniform distribution of ionized precursor gases which may, in turn, result in unwanted variations in material deposition rates across a semiconductor substrate undergoing processing.

To introduce further complexity, in some instances, even a minuscule variation in the distribution of RF energy within a fabrication chamber may give rise to larger and larger variations after only a short period of time. Such positive feedback, in which small variations in distribution of RF energy quickly bring about larger variations in the distribution or density of RF energy in a fabrication chamber, may result in the introduction of a number of unwanted consequences. For example, variations in the distribution or density of RF energy in a fabrication chamber may give rise to changes in voltage and/or current magnitudes present at an RF coupling structure within the fabrication chamber. Such changes in voltage and/or current magnitudes may give rise to an abrupt plasma mode transition such as a transition from a high-density, inductive (or "H" mode) to a low-density, capacitive (or "E" mode). To transition plasma generation back to an inductive mode, the output power of the RF current generator may be decreased, or may be interrupted completely. Such occasional power decreases and/or interruptions in RF output current may diminish plasma generation which may, in turn, necessitate unwanted increases in semiconductor processing times and/or may impact wafer-to-wafer process repeatability, for example.

Changes to RF power coupled to a coupling structure at a process station of a multi-station integrated circuit fabrication chamber may additionally affect operations conducted at other process stations. For example, if power from a single RF current generator is distributed to two or more stations, an increase in RF power coupled to a first process station may bring about reductions in power coupled to other stations. In some instances, in response to an increase in power coupled to a first station of a multi-station fabrication chamber, power to a second station of the fabrication chamber may fall below a threshold amount, which may cause plasma extinction in the second station. In such an instance, fabrication processes at the second station may consume longer periods of time, which may increase cost, decrease equipment availability for other processing operations, and/or decrease film quality. In some instances, excessive occurrences of plasma extinction may bring about the need for additional processing and/or metrology to determine if quality of a fabricated wafer has been negatively impacted.

Accordingly, it may be appreciated that obtaining uniformity in plasma generation may be desirable in many integrated circuit fabrication operations. Thus, one approach toward obtaining uniformity in plasma generation within a fabrication chamber involves a use of multiple RF coupling structures, as opposed to use of a single RF coupling structure, which may operate to more evenly distribute RF energy within a fabrication chamber. A more even distribution of RF energy within a fabrication chamber may, in turn, give rise to a more evenly distributed generation of an ionized plasma material, which may serve to evenly distribute ionized precursor gases across a semiconductor wafer undergoing processing. However, despite advantages of multiple RF coupling structures in a fabrication chamber, such additional coupling structures may introduce further complexities by increasing opportunities for RF energy to be disproportionately coupled to certain regions of a fabrication chamber with respect to other regions. As previously noted, such disproportionate coupling of RF energy within a fabrication chamber may bring about positive feedback in which small spatial and/or temporal variations in RF power may bring about large variations in RF current and voltage distributions across an RF coupling structure.

Thus, for the above-identified reasons, and potentially others, it may be advantageous to implement plasma-forming arrangements of one or more RF coupling structures in which nonuniformities in RF power coupling within a fabrication chamber are controlled and/or reduced via negative feedback. In such an arrangement, responsive to the disproportionate coupling of RF energy to a region of a fabrication chamber, power coupled to a plasma-forming RF coupling structure may be quickly reduced. In particular embodiments, such reduction in current coupled to a plasma forming RF coupling structure may be brought about nearly instantaneously and as a consequence of the inherent design of the RF coupling structure. Accordingly, in particular embodiments, as an RF coupling structure begins to disproportionately couple RF energy to a region of a fabrication chamber, thereby increasing plasma density in the region, parameters of the RF power coupled to the coupling structure may be adjusted. Such adjustment in RF power parameters may decrease plasma density in the region, thereby returning the RF energy distribution within the chamber to a more uniform state.

In particular embodiments, such negative feedback may be introduced utilizing an inherent electrical characteristic, such as impedance of a resonant RF coupling structure. For example, as described herein, an increase in plasma density may bring about a reduction in impedance exhibited by a resonant RF coupling structure that is at least partially surrounded by an ionized plasma material. Such decrease in resonant RF coupling structure impedance may increase the demand for electrical current to be conducted by the resonant structure. Accordingly, an increased current may flow from an RF current generator to the RF coupling structure. However, as the current demand of the resonant RF coupling structure increases, a voltage drop may occur at an output node of the RF current generator. Such voltage drop may occur in response to the RF current generator having a non-negligible source impedance. Thus, the voltage drop at the output port of the RF current generator may bring about a decreased current flow, which may operate to reduce the current delivered to the resonant circuit. Consequently, current conducted by the resonant RF coupling structure may be quickly (e.g., virtually instantaneously) returned to a nominal level.

It may be appreciated that the above-described approach toward maintaining a substantially constant current flow to an RF coupling structure represents a negative-feedback control system having a negligible or virtually zero (0) response time. This is to say that a momentary increase in current conduction to a resonant structure, such as in response to a localized increase in density of an ionized plasma material formed by the resonant structure, can be nearly instantaneously returned to a steady-state value. In some instances, current conduction to a resonant RF coupling structure may be returned to a nominal operating point in less than about 1.0 µs. In particular embodiments, a transmission line length, such as a length corresponding to one half of the wavelength of an RF current in the transmission line medium, may be utilized to transform impedances of a resonant structure. Such impedance transformation may provide additional control over an impedance presented to an RF current generator.

In other instances, a single RF current generator may be coupled to two or more resonant RF coupling structures at least partially immersed within an ionized plasma material. In such instances, negative feedback may bring about substantially constant current flow to each resonant structure, even as plasma density local to one of the resonant RF coupling structures increases. For example, in an arrangement involving first and second resonant RF coupling structures, a momentary increase in current conduction to the first resonant RF coupling structure may be followed by an immediate return to nominal current conduction. Meanwhile, current conduction to the second resonant RF coupling structure may remain steady and unvarying.

Particular embodiments may additionally make possible the coupling of relatively large RF currents within an individual coupling structure without necessitating correspondingly large currents at an output port of an RF current generator. For example, in particular embodiments, an RF coupling structure may operate as a circuit in which an RF current oscillates at a signal frequency (e.g., 13.56 MHz) utilizing a much smaller input current. In an example, such as described in reference to FIG. 10 herein, an oscillating current having a magnitude of approximately 85 A may be formed utilizing an input current of approximately 10 A. In such a circuit, for example, an increase in plasma density reduces the inductance exhibited by the circuit, which, in turn, increases the capacitance of the circuit. Accordingly, in response to the circuit exhibiting greater capacitance, power coupled to plasma-forming RF coupling structures may be reduced.

In particular embodiments, plasma-forming RF coupling structures may operate while being at least partially immersed in an ionized plasma material. Such partial or total immersion within an ionized plasma material serves to increase coupling between an RF coupling structure. In certain embodiments, increased coupling between an RF coupling structure and an ionized plasma material may serve to strengthen the negative feedback relationship between the increased plasma density and the capacitance exhibited by a resonant circuit. Accordingly, small spatial and/or temporal variations in plasma density at regions of a fabrication chamber may bring about even faster correction of such spatial and temporal variations in plasma density.

Certain embodiments may be utilized in connection with a number of wafer fabrication processes, such as various plasma-enhanced atomic layer deposition (PEALD) processes (e.g., PEALD1, PEALD2), various plasma-enhanced chemical vapor deposition (e.g., PECVD1, PECVD2, PECVD3) processes, or may be utilized on-the-fly during single deposition processes. In certain embodiments, a RF current generator having multiple output ports may be utilized at any frequency, such as at frequencies between 300 kHz and 60 MHz, which may include frequencies of about 400 kHz, about 440 kHz, about 1 MHz, about 2 MHz, about 4 MHz, about 13.56 MHz, about 20 MHz and about 27.12 MHz. However, in other embodiments, RF current generators having multiple output ports may operate at any frequency, which may include relatively low frequencies, such as between 50 kHz and 300 kHz, as well as higher frequencies, such as frequencies of between about 60 MHz and about 100 MHz, virtually without limitation.

Particular embodiments described herein may show and/or describe multi-station semiconductor fabrication chambers comprising 4 process stations. However, the disclosed embodiments are intended to embrace multi-station integrated circuit fabrication chambers that include any number of process stations. Thus, in certain embodiments, an output signal of a RF current generator may be divided among, for example, 2 process stations or 3 process stations of a fabrication chamber. An output current from a RF current generator may be divided among a larger number of process stations virtually without limitation, such as 5 process stations, 6 process stations, 8 process stations, 10 process stations. Particular embodiments described herein may show and/or describe utilization of a single, relatively low-frequency RF signal, such as a frequency of between about 300 kHz and about 2 MHz, as well as a single, relatively high-frequency RF current, such as a frequency of between 2 MHz and 100 MHz. However, the disclosed embodiments are intended to embrace the use of any number of radio frequencies, such as frequencies below about 2 MHz as well as radio frequencies above about 2 MHz.

Manufacture of semiconductor devices may involve depositing or etching of one or more thin films on or over a planar or non-planar substrate in connection with an integrated circuit fabrication process. In some aspects of an integrated circuit fabrication process, it may be useful to deposit thin films that conform to unique substrate topography. One type of reaction that is useful in many instances may involve chemical vapor deposition (CVD). In certain CVD processes, gas phase reactants introduced into stations of a reaction chamber simultaneously undergo a gas-phase reaction. The products of the gas-phase reaction deposit on the surface of the substrate. A reaction of this type may be driven by, or enhanced by, presence of a plasma, in which case the process may be referred to as a plasma-enhanced chemical vapor deposition (PECVD) reaction. As used herein, the term CVD is intended to include PECVD unless otherwise indicated.

In another example, as previously alluded to, some deposition processes involve multiple film deposition cycles, each producing a discrete film thickness. For example, in atomic layer deposition (ALD), thickness of a deposited layer may be limited by an amount of one or more film precursor reactants, which may adsorb onto a substrate surface, so as to form an adsorption-limited layer, prior to the film-forming chemical reaction itself. Thus, a feature of ALD involves the formation of thin layers of film, such as layers having a width of a single atom or molecule, which are used in a repeating and sequential matter. As device and feature sizes continue to be reduced in scale, and as three-dimensional devices and structures become more prevalent in integrated circuit (IC) design, the capability of depositing thin conformal films (e.g., films of material having a uniform thickness relative to the shape of the underlying structure) continues to gain in importance. Thus, in view of ALD being a film-forming technique in which each deposition cycle operates to deposit a single atomic or molecular layer of material, ALD may be well-suited to the deposition of conformal films. In some instances, device fabrication processes involving ALD may include multiple ALD cycles, which may number into the hundreds or thousands, may then be utilized to form films of virtually any desired thickness. Further, in view of each layer being thin and conformal, a film that results from such a process may conform to a shape of any underlying device structure. In certain embodiments, an ALD cycle may include the following steps:

Exposure of the substrate surface to a first precursor.

Purge of the reaction chamber in which the substrate is located.

Activation of a reaction of the substrate surface, such as by exposing the substrate surface with a plasma and/or a second precursor.

Purge of the reaction chamber in which the substrate is located.

The duration of each ALD cycle may, at least in particular embodiments, be less than about 25 seconds or less than about 10 seconds or less than about 5 seconds. The plasma exposure step (or steps) of the ALD cycle may be of a short duration, such as a duration of about 1 second or less.

Turning now to the figures, FIG. 1 shows an example apparatus suitable for depositing or etching a film on or over a substrate utilizing any number of processes, according to various embodiments. Processing apparatus 100 of FIG. 1 depicts single process station 102 of a process chamber with a single substrate holder 108 (e.g., a pedestal) in an interior volume, which may be maintained under vacuum by vacuum pump 118. Showerhead 106 and gas delivery system 130, which may be fluidically coupled to the process chamber, may permit the delivery of film precursors, for example, as well as carrier and/or purge and/or process gases, secondary reactants, etc. Equipment utilized in the generation of plasma within the process chamber is also shown in FIG. 1. The apparatus schematically illustrated in FIG. 1 may be adapted for performing, in particular, plasma-enhanced CVD.

In FIG. 1, gas delivery system 130 includes a mixing vessel 104 for blending and/or conditioning process gases for delivery to showerhead 106. One or more mixing vessel inlet valves 120 may control introduction of process gases to mixing vessel 104. Particular reactants may be stored in liquid form prior to vaporization and subsequent delivery to process station 102 of a process chamber. The embodiment of FIG. 1 includes a vaporization point 103 for vaporizing liquid reactant to be supplied to mixing vessel 104. In some embodiments, vaporization point 103 may include a heated liquid injection module. In some other embodiments, vaporization point 103 may include a heated vaporizer. In yet other embodiments, vaporization point 103 may be eliminated from the process station. In some embodiments, a liquid flow controller (LFC) upstream of vaporization point 103 may be provided for controlling a mass flow of liquid for vaporization and delivery to process station 102.

Showerhead 106 may operate to distribute process gases and/or reactants (e.g., film precursors) in the direction of substrate 112 at the process station, the flow of which may be controlled by one or more valves upstream from the showerhead (e.g., valves 120, 120A, 105). In the embodiment of FIG. 1, substrate 112 is depicted as located beneath showerhead 106, and is shown resting on a pedestal 108. Showerhead 106 may be of any suitable shape, and may include any suitable number and arrangement of ports for distributing process gases to substrate 112. In some embodiments involving 2 or more stations, gas delivery system 130 includes valves or other flow control structures upstream from the showerhead, which can independently control the flow of process gases and/or reactants to each station so as to permit gas flow to one station while prohibiting gas flow to a second station. Furthermore, gas delivery system 130 may be configured to independently control process gases and/or reactants delivered to each station in a multi-station apparatus such that the gas composition provided to different stations is different (e.g., the partial pressure of a gas component may vary between stations at the same time).

In FIG. 1, gas volume 107 is depicted as being located beneath showerhead 106. In some embodiments, pedestal 108 may be raised or lowered to expose substrate 112 to gas volume 107 and/or to vary the size of gas volume 107. Optionally, pedestal 108 may be lowered and/or raised during portions of the deposition process to modulate process pressure, reactant concentration, etc., within gas volume 107. Showerhead 106 and pedestal 108 are depicted as being electrically coupled to RF current generator 114 and matching network 116 for providing an RF current of sufficient magnitude to a plasma-forming structure. However, in other embodiments, showerhead 106 may not be utilized in connection with a plasma-forming structure. In such embodiments, showerhead 106 may be replaced by (or supplemented with) a conductive loop, which may be immersed within gas volume 107. In such embodiments, the plasma density is controlled (e.g., via a system controller having appropriate machine-readable instructions and/or control logic) by controlling one or more of a process station pressure, a gas concentration, output current of an RF current generator, and so forth. For example, RF current generator 114 and matching network 116 may be operated at any suitable RF power level, which may operate to bring about formation of a an ionized plasma material having a desired composition of radical gaseous species. In addition, RF current generator 114 may provide RF power having more than one frequency component, such as a low-frequency component (e.g., less than about 2 MHz) as well as a high frequency component (e.g., greater than about 2 MHz). Use of a conductive loop as a plasma-forming RF coupling structure is discussed, for example, in relation to FIGS. 3-12, hereinbelow.

In the embodiment of FIG. 1, heater 110 may be placed beneath pedestal 108. Heater 110, which may utilized a resistive heating coil, may bring about heating of pedestal 108 as well as substrate 112. Thus, in certain embodiments, showerhead 106 (and/or an alternative plasma-forming RF coupling structure) and heater 110 may cooperate to enhance formation of an ionized plasma material which may, consequently, accelerate material deposition and/or material removal (e.g., etching) processes occurring within process station 102.

In some embodiments, conditions to bring about the formation and maintenance of an ionized plasma material are controlled via appropriate hardware and/or appropriate machine-readable instructions accessible to a system controller. Machine-readable instructions may include a non-transitory sequence of input/output control (IOC) instructions encoded on a computer-readable media. In one example, the instructions for generating or maintaining an ionized plasma material are provided in the form of a plasma activation recipe of a process recipe. In some cases, process recipes may be sequentially arranged, so that at least some instructions for the process can be executed concurrently. In some embodiments, instructions for setting one or more plasma parameters may be included in a recipe preceding a plasma formation process. For example, a first recipe may include instructions for setting a flow rate of an inert (e.g., helium) and/or a reactant gas, instructions for setting an RF current generator to a power set point and time delay instructions for the first recipe. In some deposition processes, a duration of a plasma strike may correspond to a duration of a few seconds, such as from about 3 seconds to about 15 seconds, or may involve longer durations, such as durations of up to about 30 seconds, for example. In certain embodiments described herein, much shorter plasma strikes may be applied during a processing cycle.

Figure 2:
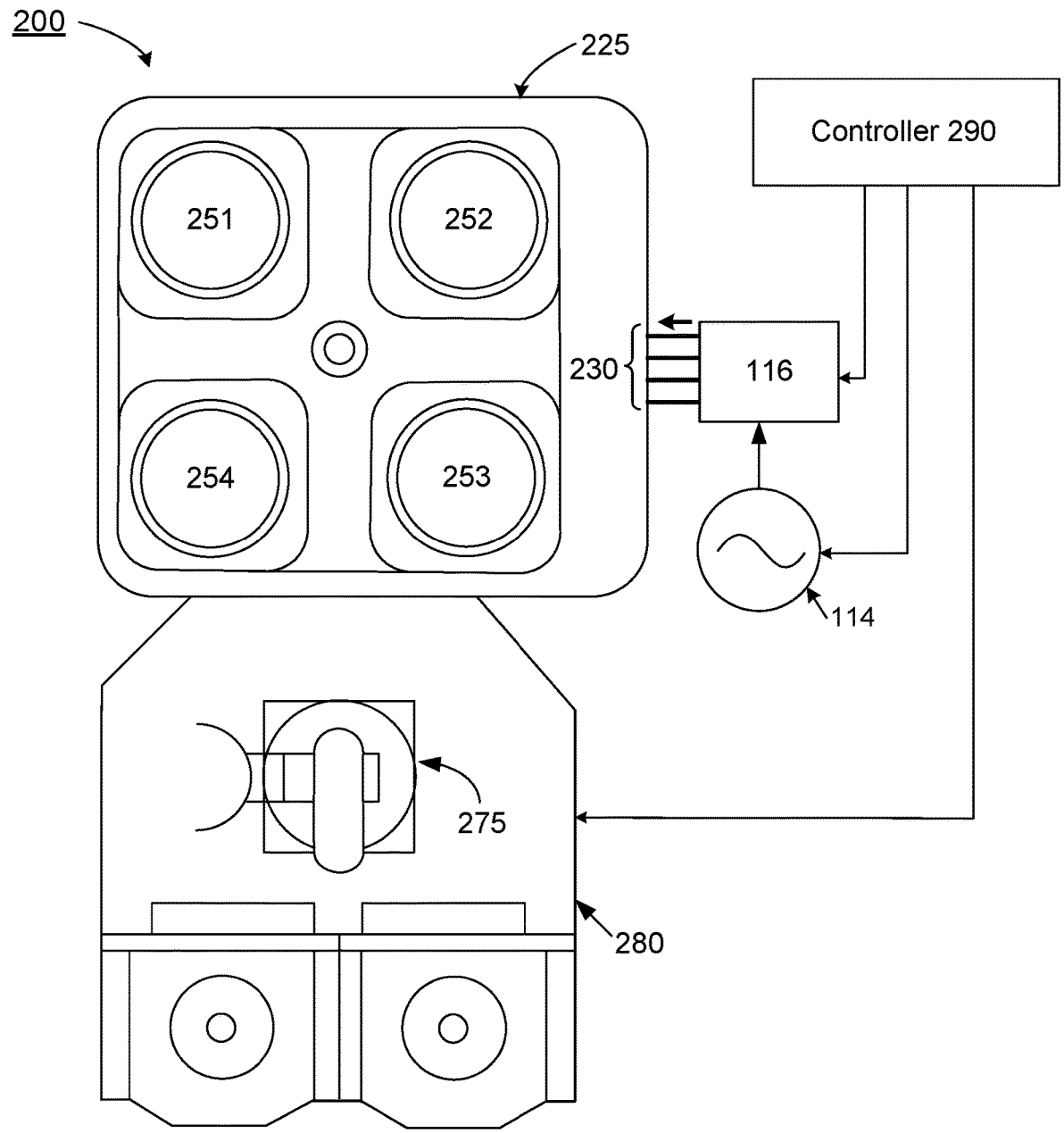
FIG. 2 is a schematic view of a multi-station integrated circuit fabrication chamber that utilizes active components, according to an embodiment.

For simplicity, processing apparatus 100 is depicted in FIG. 1 as a standalone station (102) of a process chamber for maintaining a low-pressure environment. However, it may be appreciated that a plurality of process stations may be included in a multi-station processing tool environment, such as shown in FIG. 2, which depicts a schematic view of an example multi-station processing tool, according to various embodiments. Processing tool 200 employs an integrated circuit fabrication chamber 225 that includes multiple process stations. Process stations may be utilized to perform processing operations on a substrate retained via a wafer holder, such as pedestal 108 of FIG. 1, at a particular process station. In the example of FIG. 2, integrated circuit fabrication chamber 225 is shown as including 4 process stations 251, 252, 253, and 254. Other similar multi-station processing apparatuses may include more or fewer process stations depending on the implementation and, for instance, the desired level of parallel wafer processing, size/space constraints, cost constraints, etc. Also shown in FIG. 1B is substrate handler robot 275, which operates under the control of system controller 290, is configured or adapted to move substrates from a wafer cassette (not shown in FIG. 2). Substrates from a wafer cassette may be moved from loading port 280 and into multi-station integrated circuit fabrication chamber 225 and onto one of process stations 251, 252, 253, and/or 254.

FIG. 2 also depicts an embodiment of a system controller 290 employed to control process conditions and operating states of processing tool 200. System controller 290 may include one or more memory devices, one or more mass storage devices, and one or more processors. The one or more processors may include a central processing unit, analog and/or digital input/output connections, stepper motor controller circuitry, etc. In some embodiments, system controller 290 controls all of the activities of process tool 200. System controller 290 executes system control software stored in a mass storage device, which may be loaded into a memory device, and executed by a processor of the system controller. Software to be executed by a processor of system controller 290 may include instructions for controlling the timing, mixture of gases, fabrication chamber and/or station pressure, fabrication chamber and/or station temperature, wafer temperature, substrate pedestal, chuck and/or susceptor position, number of cycles performed on one or more substrates, and other parameters of a particular process performed by process tool 200. These programmed processes may include various types of processes including, but not limited to, processes related to determining an amount of accumulation on a surface of the chamber interior, processes related to the deposition of film on substrates including numbers of ALD cycles, determining and obtaining a number of compensated cycles, and processes related to cleaning the chamber. System control software, which may be executed by one or more processors of system controller 290, may be configured in any suitable way. For example, various process tool component subroutines or control objects may be written to control operation of the process tool components necessary to carry out various tool processes.

In some embodiments, software for execution by way of a processor of system controller 290 may include input/output control (IOC) sequencing instructions for controlling the various parameters described above. For example, each phase of deposition and deposition cycling of a substrate may include one or more instructions for execution by system controller 290. The instructions for setting process conditions for an ALD conformal film deposition process phase may be included in a corresponding ALD conformal film deposition recipe phase. In some embodiments, the recipe phases may be sequentially arranged, so that all instructions for a process phase are executed concurrently with that process phase.

Other computer software and/or programs stored on a mass storage device of system controller 290 and/or a memory device accessible to system controller 290 may be employed in some embodiments. Examples of programs or sections of programs for this purpose can include a substrate positioning program, a process gas control program, a pressure control program, a heater control program, and a plasma control program. A substrate positioning program may include program code for process tool components utilized to load a substrate onto pedestal 108 (of FIG. 1) and to control the spacing between the substrate and other portions of process tool 200. A positioning program can include instructions for appropriately moving substrates into and out of the reaction chamber as necessary to deposit films on substrates, etch substrates, and to clean the chamber.

A process gas control program may include code for controlling gas composition and/or flow rates and for controlling the flow of gas into one or more process stations prior to deposition, which may bring about stabilization of the pressure in the process station. In some embodiments, the process gas control program includes instructions for introducing gases during formation of a film on a substrate in the reaction chamber. This may include introducing gases for a different number of cycles for one or more substrates within a batch of substrates. A pressure control program may include code for controlling the pressure in the process station by regulating, for example, a throttle valve in an exhaust system of the process station, a gas flow into the process station, etc. The pressure control program may include instructions for maintaining the same pressure during the deposition of a differing number of cycles on one or more substrates during the processing of the batch.

System controller 290 may additionally control and/or manage the operations of RF current generator 114, which may generate and transmit RF power to multi-station integrated circuit fabrication chamber 225 via RF power input ports 230. Such operations may relate to determining upper and lower thresholds for RF power to be delivered to integrated circuit fabrication chamber 225, RF power activation/deactivation times, RF power on/off duration, duty cycle, operating frequencies, and so forth. Additionally, system controller 290 may determine a set of normal operating parameters of RF power to be delivered to integrated circuit fabrication chamber 225 by way of RF power input ports 230. Such parameters may include upper and lower thresholds of, for example, RF power reflected from integrated circuit fabrication chamber 225 in the direction of matching network 116 in terms of a reflection coefficient (e.g., the scattering parameter $S_{11}$) and/or a voltage standing wave ratio. Such parameters may also include upper and lower thresholds of a voltage applied to RF power input ports 230, upper and lower thresholds of current conducted through RF power input ports 230, as well as an upper threshold for a magnitude of a phase angle between a voltage and a current conducted through RF power input ports 230. Such thresholds may be utilized in defining "out-of-range" RF current characteristics. For example, reflected power greater than an upper threshold may indicate an out-of-range RF power parameter. Likewise, an applied voltage or conducted current having a value below a lower threshold or greater than an upper threshold may indicate out-of-range RF current characteristics.

In certain embodiments, RF current generator 114 may operate to generate two frequencies, such as a first frequency of about 400 kHz and a second frequency of about 13.56 MHz. It should be noted, however, that RF current generator 114 may be capable of generating additional frequencies, such as frequencies of between about 300 kHz and about 100 MHz, and embodiments are not limited in this respect. In particular embodiments, currents generated by RF current generator 114 may include at least one low frequency (LF), which may be defined as a frequency of between about 300 kHz and about 2 MHz, and at least one high frequency (HF), which may be defined as a frequency greater than about 2 MHz but less than about 100 MHz.

In some embodiments, there may be a user interface associated with system controller 290. The user interface may include a display screen, graphical software displays of the processing tool and/or process conditions, and user input devices such as pointing devices, keyboards, touch screens, microphones, etc.

In some embodiments, parameters adjusted by system controller 290 may relate to process conditions. Non-limiting examples may include process gas composition and flow rates, temperature, pressure, plasma conditions, etc. These parameters may be provided to the user in the form of a recipe, which may be entered utilizing the user interface. The recipe for an entire batch of substrates may include compensated cycle counts for one or more substrates within the batch in order to account for thickness trending over the course of processing the batch.

Signals for monitoring a fabrication process may be provided by analog and/or digital input connections of system controller 290 from various process tool sensors. Signals for controlling the process may be transmitted by way of the analog and/or digital output connections of process tool 200. Non-limiting examples of process tool sensors that may be monitored include mass flow controllers, pressure sensors (such as manometers), thermocouples, etc. Sensors may also be included and used to monitor and determine the accumulation on one or more surfaces of the interior of the chamber and/or the thickness of a material layer on a substrate in the chamber. Appropriately programmed feedback and control algorithms may be used with data from these sensors to maintain process conditions.

System controller 290 may provide program instructions for implementing the above-described deposition processes. The program instructions may control a variety of process parameters, such as DC power level, pressure, temperature, number of cycles for a substrate, amount of accumulation on at least one surface of the chamber interior, etc. The instructions may control the parameters to operate in-situ deposition of film stacks according to in embodiment described herein.

For example, system controller 290 may include control logic for performing the techniques described herein, such as determining (a) an amount of accumulated deposition material currently on at least an interior region of the deposition chamber interior. In addition, system controller 290 may include control logic for applying the amount of accumulated deposition material determined in (a), or a parameter derived therefrom, to a relationship between (i) a number of ALD cycles required to achieve a target deposition thickness, and (ii) a variable representing an amount of accumulated deposition material, in order to obtain a compensated number of ALD cycles for producing the target deposition thickness given the amount of accumulated deposition material currently on the interior region of the deposition chamber. System controller 290 may include control logic for performing number of ALD cycles on one or more substrates in the batch of substrates. System controller 290 may also include control logic for determining that the accumulation in the chamber has reached an accumulation limit and stopping the processing of the batch of substrates in response to that determination, and for initiating a cleaning operation of the chamber interior.

Figure 3:
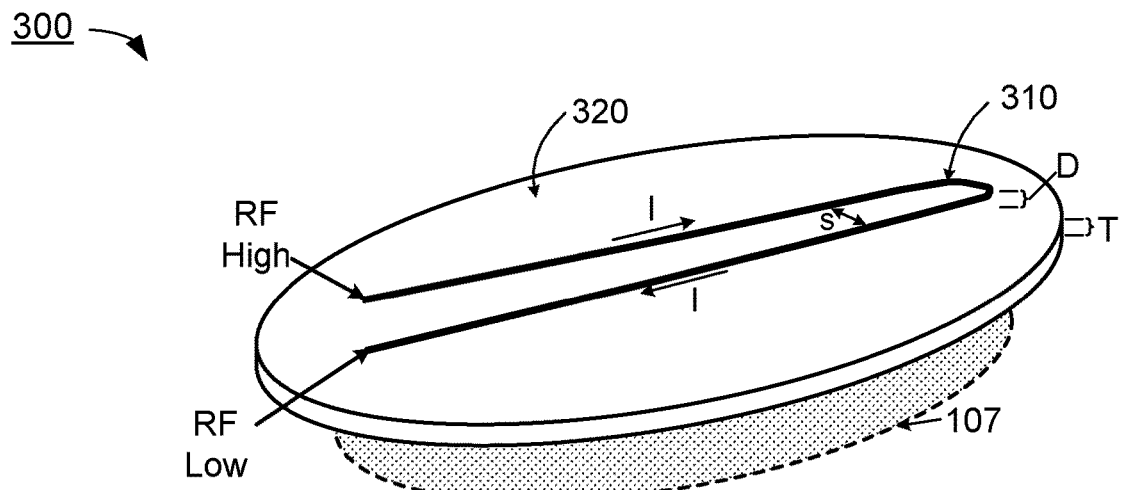
FIG. 3 shows a single conductive loop for forming an ionized plasma material, according to an embodiment.

Although FIGS. 1 and 2 are discussed in the context of showerhead 106 being utilized as an RF coupling structure to bring about formation of an ionized plasma material within a fabrication chamber, an ionized plasma material may be formed utilizing RF coupling structures in place of (or in addition to) showerhead 106. Accordingly, FIG. 3 a shows a single conductive loop for forming an ionized plasma material, according to an embodiment 300. In FIG. 3, conductive loop 310 may be formed from a metallic conductor (e.g., copper) and may be capable of conducting a current of, for example, between 25 A and 150 A. Conductive loop 310 may be elongated so as to conform to the shape of a hairpin in which an input current and a return current (I) conduct in opposite directions, such as between the RF High coupling port and the RF Low coupling port of conductive loop 310. Portions of the hairpin-shaped conductor of conductive loop 310 are indicated as being separated from each other by a pitch (S). Conductive loop 310 is positioned at a first (e.g., upper) side of window 320 while gas volume 107 is exposed to a second (e.g., lower) side of window 320. Accordingly, responsive to an RF current (I) having a sufficient magnitude, which generates a magnetic (or "H") field proximate to the conductive loop, at least a portion of the gas within gas volume 107 may be converted to an ionized plasma material. In certain embodiments, the thickness (T) and pitch (S) of conductive loop 310, RF drive current (I), voltage of the coupling port labeled RF High relative to the coupling port labeled RF Low, distance (D) between conductive loop 310 and the first (e.g., upper) surface of window 320 may be selected so as to bring about plasma formation within a region of gas volume 107 that is up to 2 times the pitch (S) shown in FIG. 3.

Figure 4:
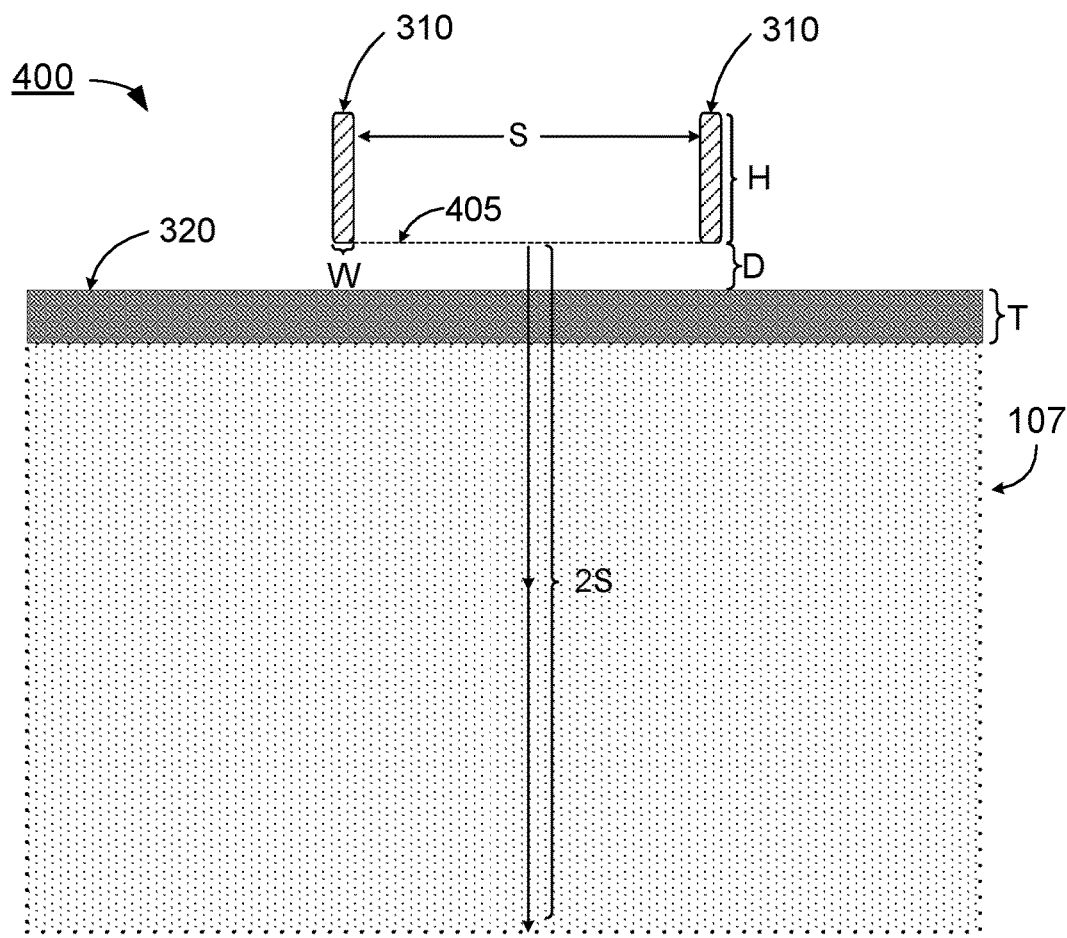
FIG. 4 shows an end view of the conductor of a conductive loop for forming an ionized plasma material, according to an embodiment.

FIG. 4 shows an end view of the conductor of a conductive loop for forming an ionized plasma material, according to an embodiment 400. As shown in FIG. 4, portions of conductive loop 310, each having a width (W) and a height (H), are separated from each other by pitch (S). The plane of conductive loop 310, which is indicated by a dotted line 405, is separated from window 320 by a distance (D). As previously described in relation to FIG. 3, an RF current (I) having a sufficient magnitude may generate a magnetic field, which brings about formation of a plasma within a region of gas volume 107. In the embodiment of FIG. 4, plasma may be generated within a portion of gas volume 107 that extends to a distance (2S) from the plane of conductive loop 310 (indicated by dotted line 405).

Figure 5:
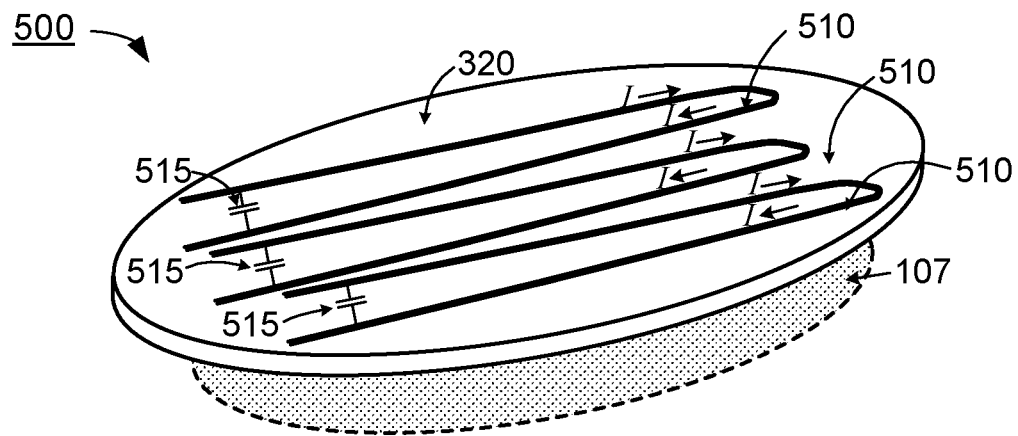
FIG. 5 shows three conductive loops for forming an ionized plasma material, according to an embodiment.

From the arrangement of FIGS. 3-4, it may be appreciated that a single hairpin-shaped conductive loop, such as conductive loop 310, may be capable of converting perhaps only a relatively small portion of gas within gas volume 107 to an ionized plasma. Accordingly, FIG. 5 shows three conductive loops for forming an ionized plasma material, according to an embodiment 500. The arrangement of FIG. 5 may represent an improvement over the single conductive loop of FIGS. 3-4 by bringing about formation of an ionized plasma material within a larger portion of gas volume 107. In the embodiment of FIG. 5, use of 3 conductive loops 510 may bring about plasma formation in a region that is (nominally) 3 times the size of the region provided by a single conductive loop. Although not shown explicitly in FIG. 5, elements of each of conductive loops 510 are coupled to an RF High and an RF Low coupling port, each of which provides a current (I). Each of conductive loops 510, along with the positioning of each conductive loop relative to gas volume 107 and window 320, is similar to that described in relation to conductive loop 310 of FIG. 3.

In addition to utilizing a greater number of conductive loops to bring about formation of an ionized plasma material, such as from 1 conductive loop to 3 conductive loops, capacitor 515 may be coupled to each of conductive loops 510. In particular embodiments, by way of coupling of a capacitor having value of capacitance, each of conductive loops 510 may resonate at a predetermined frequency. At such a resonant frequency, or perhaps within between 5 and 15% of the resonant frequency, an increased current (I) may be permitted to flow within each conductive loop. Such increased current flow may give rise to generation of increased magnetic field (H) by each conductive loop, which, in turn, may bring about formation of plasma within a larger region of gas volume 107.

Figure 6:
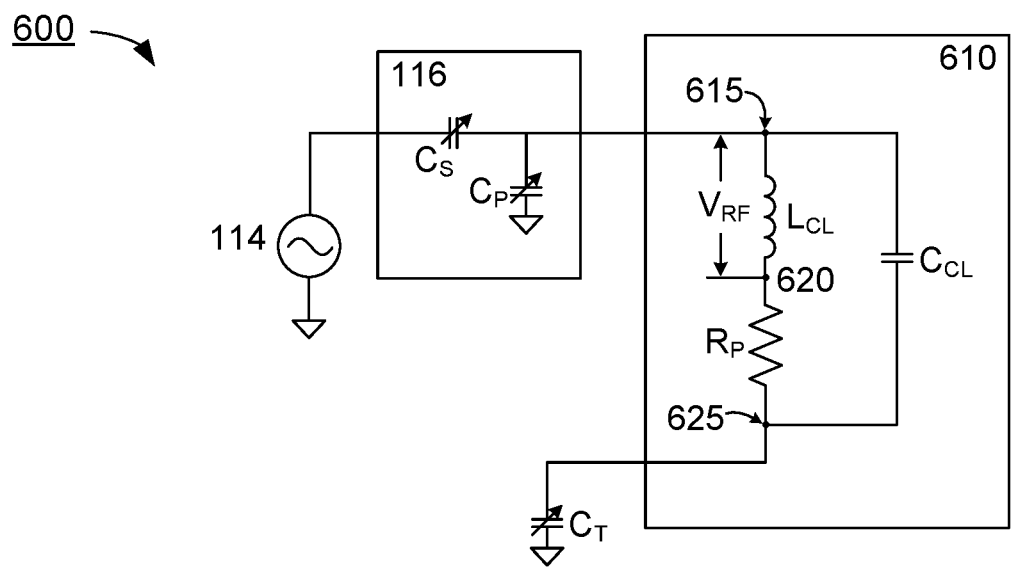
FIG. 6 shows an RF generator, matching network, and equivalent circuit representing a conductive loop and capacitor combination, according to an embodiment.

FIG. 6 shows RF current generator 114, matching network 116, and equivalent circuit 610 representing a conductive loop and capacitor combination, according to an embodiment 600. Although equivalent circuit 610 may correspond to a single conductive loop 510 and capacitor 515, circuit elements of equivalent circuit 610 may be modified to correspond to any number of conductive loops 510. The circuit elements of equivalent circuit 610 may additionally be modified to correspond to an RF coupling structure other than a hairpin-shaped loop, such as an elliptical loop, a rectangular loop (perhaps having rounded corners), and so forth. Thus, in view of conductive loop 510 exhibiting an inductance, at least at particular frequencies, such as frequencies below about 30 MHz, circuit elements of matching network 116 may correspond to capacitors (e.g., capacitors $C_S$ and $C_P$). Such capacitances may be inserted into the circuit between RF current generator 114 an equivalent circuit 610 so as to present a substantially matched load to the RF current generator. Termination capacitance $C_T$ operates to raise the voltage at node 625 to a value above a reference potential, which may reduce voltage swings within equivalent circuit 610. As described in reference to FIG. 2, RF current generator 114 and RF matching network 116 may operate under the control of controller 290.

With respect to equivalent circuit 610, circuit element $L_{CL}$ corresponds to an inductor having a value exhibited by conductive loop 510. In an example, inductance of circuit element $L_{CL}$ may correspond to a value of about 482 nH. However, in other examples, circuit element $L_{CL}$ may correspond to any other value, such as a value of less than about 482 nH (e.g., 475 nH, 450 nH, 400 nH, and so forth) or may correspond to a value greater than about 482 nH (e.g., 500 nH, 525 nH, 600 nH, and so forth). Circuit element $C_{CL}$ of FIG. 6, which corresponds to capacitor 515 of FIG. 5, may correspond to a value of about 300 pF. However, circuit element $C_{CL}$ of FIG. 6 may include any other value, such as values of less than about 300 pF (e.g., 275 pF, 250 pF, 200 pF, and so forth) or may correspond to a value greater than about 300 pF (e.g., 325 pF, 350 pF, and so forth). In the example of FIG. 6, selection of a capacitance of about 300 pF and an inductance of about 482 nH may permit the combination of conductive loop 510 and capacitor 515 to resonate at a frequency of about 13.24 MHz, which may be computed substantially in accordance with expression (1), below:

$$f_{resonance} = \frac{1}{2\pi\sqrt{(482 \times 10^{-9})(300 \times 10^{-12})}} = 13.24 \text{ MHz} \quad (1)$$

Thus, at a frequency of 13.24 MHz, a maximum current may conduct within conductive loop 310.

Prior to formation of an ionized plasma source within a fabrication chamber, resistance $R_P$ of FIG. 6 may comprise a negligible value. Thus, the voltage ($V_{RF}$) across equivalent circuit element $L_{CL}$ (e.g., between nodes 615 and 620) may exhibit a relatively high value. In addition, the resonant circuit formed by $L_{CL}$ and $C_{CL}$ may correspond to a circuit having a relatively high quality factor (Q). As an ionized plasma material is formed within the fabrication chamber, via conduction of a sufficient current with the in the resonant of circuit formed by $L_{CL}$ and $C_{CL}$, resistance $R_P$ exhibits a larger value. Accordingly, the voltage ($V_{RF}$) across equivalent circuit element $L_{CL}$ decreases in magnitude. Resistance $R_P$ may be characterized as a plasma-induced resistance that increases as RF power is coupled from conductive loop 310 and into a gaseous volume to form an ionized plasma material. An increase in resistance $R_P$ also brings about a lowering of the quality factor (Q) of the resonant circuit formed by $L_{CL}$ and $C_{CL}$.

It should be noted that the circuit of FIG. 6 permits a relatively high current to flow between circuit elements $L_{CL}$ and $C_{CL}$ without requiring a large current to be coupled to the resonant circuit, such as from RF current generator 114. Accordingly, it may be appreciated that an advantage of the circuit of FIG. 6 is to provide a significant magnetic field, thereby giving rise to an ionized plasma material distributed throughout a large portion of a gas volume (e.g., gas volume 107), but without necessitating excessively large currents from an RF current generator and/or an RF matching network.

In addition to increasing resistance $R_P$, generation of an ionized plasma material in a fabrication chamber may bring about a change in an inductance exhibited by a conductive loop. Thus, in an example, generation of an ionized plasma material may reduce an inductance exhibited by a conductive loop from about 482 nH to about 467 nH. Accordingly, the resonance of equivalent circuit 610 operating under plasma-generating conditions may be increased from about 13.24 MHz to about 13.45 MHz as computed substantially in accordance with expression (2) below:

$$f_{resonance} = \frac{1}{2\pi\sqrt{(467 \times 10^{-9})(300 \times 10^{-12})}} = 13.45 \text{ MHz} \quad (2)$$

Figure 7:
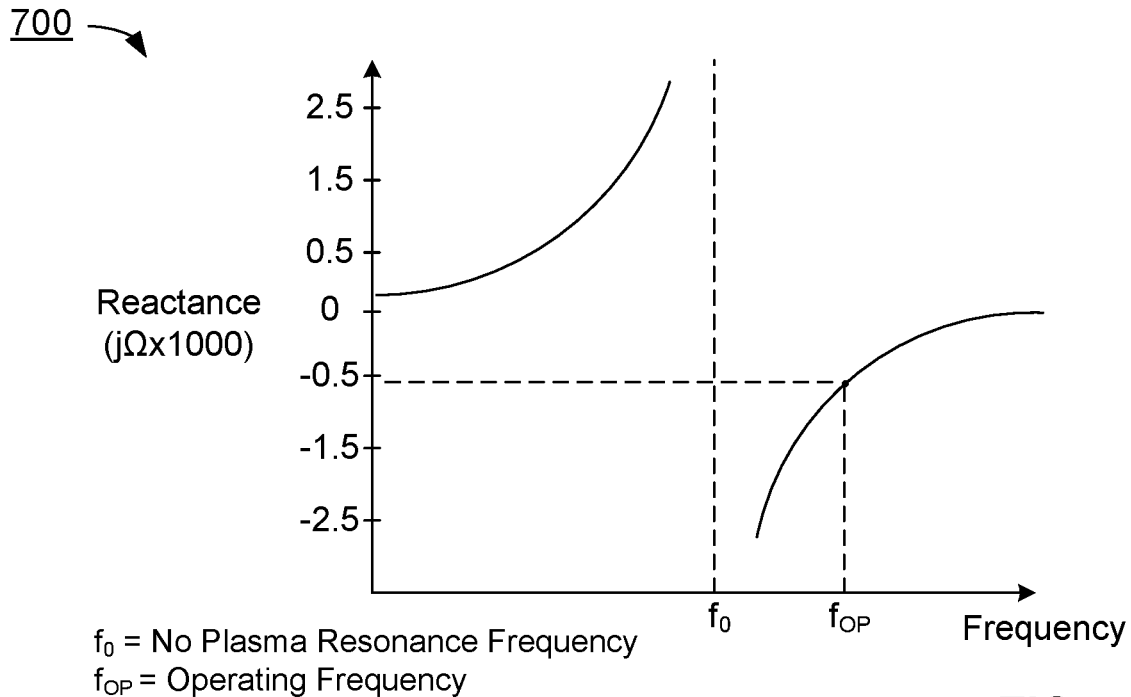
FIG. 7 shows a graph of impedance versus frequency for the equivalent circuit corresponding to the conductive loop and capacitor combination of FIG. 6 prior to formation of a plasma material, according to an embodiment.

FIG. 7 depicts reactance versus frequency for the equivalent circuit corresponding to the conductive loop and capacitor combination of FIG. 6 prior to formation of a plasma material, according to an embodiment 700. The vertical axis of FIG. 7 corresponds to reactance (series inductance) while the horizontal axis corresponds to frequency. At relatively low frequencies, the reactance of equivalent circuit 610 corresponds to a relatively low or negligible value of positive reactance. At increased frequencies, the positive reactance increases monotonically to reach a maximum value at a resonant frequency ($f_0$). At frequencies greater than the resonant frequency ($f_0$), the reactance comprises a large negative value (capacitance), which approaches a relatively low value as frequency increases. Thus, as shown, at frequencies lower than the resonant frequency ($f_0$), the inductance (such as the inductance $L_{CL}$) of equivalent circuit 610 dominates. However, at frequencies greater than the resonant frequency ($f_0$) the capacitance (such as the capacitance $C_{CL}$) of equivalent circuit 610 dominates.

In an example in which plasma formation has not occurred, the resonant frequency ($f_0$) of equivalent circuit 610 corresponds to approximately 13.24 MHz ($f_0$=13.24 MHz) as computed in accordance with expression (1) above. Accordingly, responsive to operation of equivalent circuit 610 at a frequency greater than 13.24 MHz, such as at 13.56 MHz (indicated as $f_{OP}$ in FIG. 7), the capacitive reactance exhibited by capacitance $C_{CL}$ dominates. For example, prior to plasma formation (the "No-Plasma Resonance Frequency" of FIG. 7), the reactance of equivalent circuit 610 operating at a frequency of about 13.56 MHz comprises a value of about $-j500\Omega$.

Figure 8:
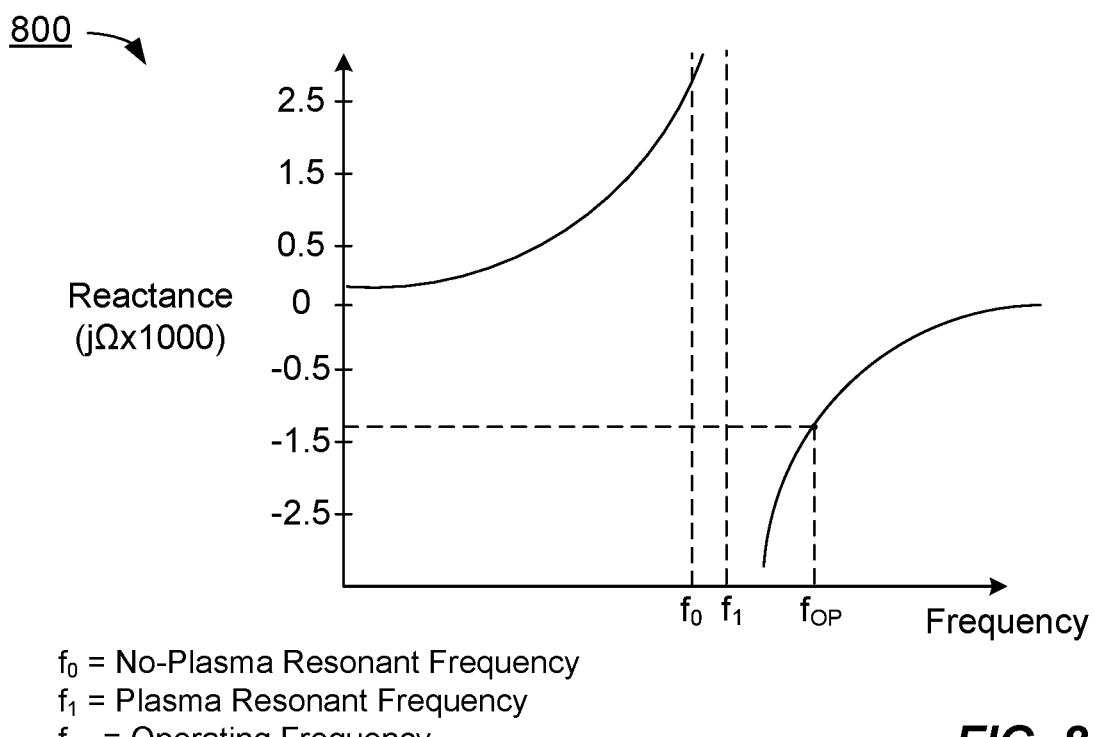
FIG. 8 shows a graph of impedance versus frequency for the equivalent circuit corresponding to the conductive loop and capacitor combination of FIG. 6 after formation of a plasma material, according to an embodiment.

However, as previously alluded to, generation of an ionized plasma material may reduce an inductance exhibited by a conductive loop from about 482 nH to a lower value, such as a value of about 467 nH. Thus, FIG. 8 shows a graph of impedance versus frequency for the equivalent circuit corresponding to the conductive loop and capacitor combination of FIG. 6 after formation of a plasma material, according to an embodiment 800. The resonance of equivalent circuit 610 after the formation of a plasma is computed substantially in accordance with expression (2) above. Accordingly, as indicated in expression (2), after formation of an ionized plasma material, the resonance of equivalent circuit 610 increases from about 13.24 MHz to about 13.45 MHz. Such increase is indicated as $f_1$ on the horizontal axis of FIG. 8. Thus, responsive to operation of equivalent circuit 610 at a frequency of 13.56 MHz ($f_{OP}$ in FIG. 8), the reactance exhibited by capacitance $C_{CL}$ increases negatively. For example, as shown in FIG. 8, following plasma formation, the reactance of equivalent circuit 610 comprises a value of about $-j1500\Omega$.

As shown in FIGS. 7 and 8, in response to the formation of plasma in a fabrication chamber, the inductive reactance exhibited by a conductive loop coupled to a capacitive element decreases. Such decrease in inductive reactance renders the conductive loop/capacitive element combination to exhibit greater capacitance (i.e., negative reactance). Accordingly, in a fabrication chamber, increases in plasma density operate to increase the capacitance of the RF coupling structure formed from a conductive loop/capacitive element combination. Responsive to increasing the capacitance of the RF coupling structure, a negative feedback loop may be introduced. In such an arrangement, a disproportionate coupling of RF energy to a region of a fabrication chamber brings about a reduction in current coupled to the RF coupling structure. Such passive compensation may be capable of rapidly compensating for nonuniformities in plasma density within the fabrication chamber.

Figure 9:
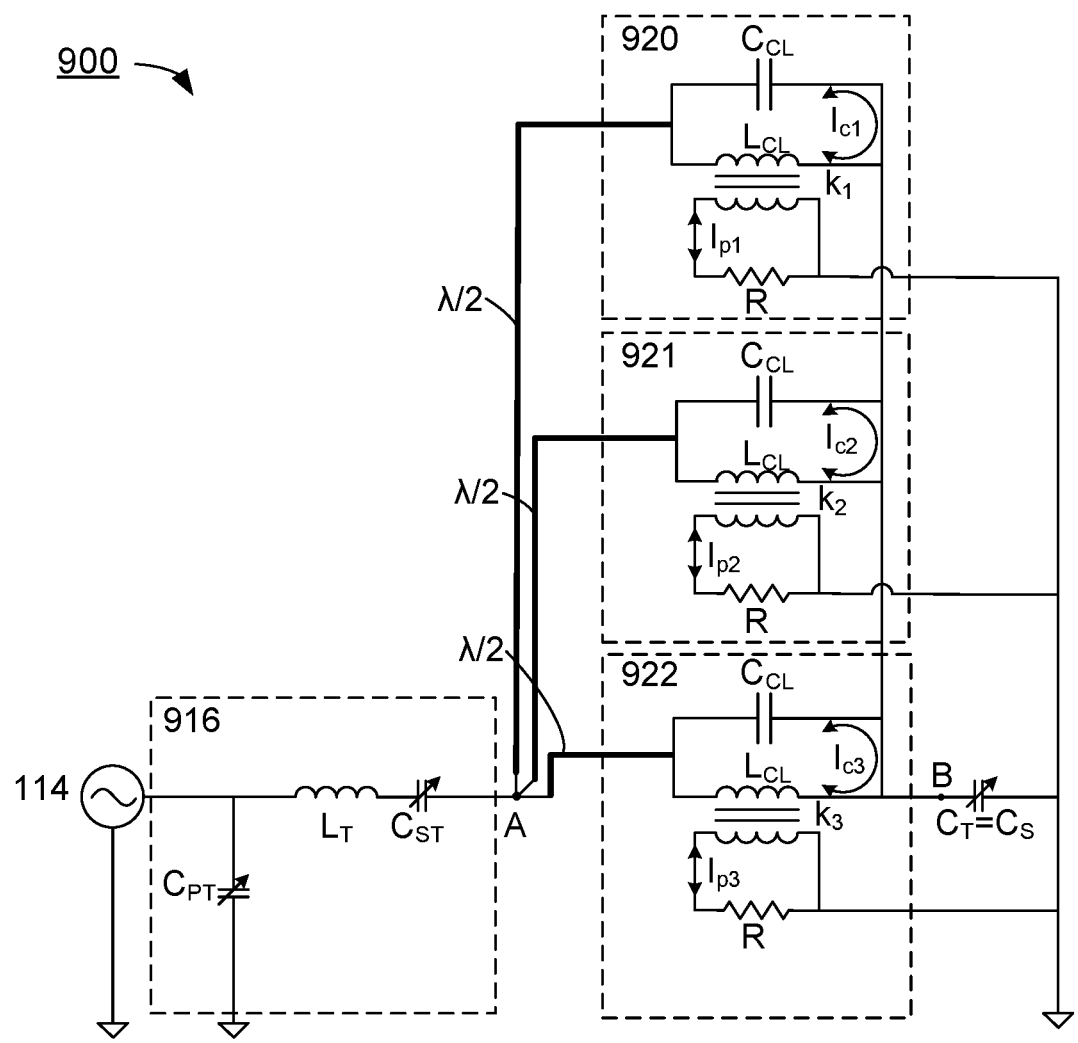
FIG. 9 shows an RF current generator, matching network, transmission line and equivalent circuit for three conductive loops for forming an ionized plasma material, according to an embodiment.

FIG. 9 shows an RF current generator, matching network, transmission line, and equivalent circuit for conductive loops for forming an ionized plasma material, according to an embodiment 900. In FIG. 9, matching circuit 916 performs a function similar to matching network 116 of FIG. 6, with the exception that matching circuit 916 incorporates transmission line effects. Accordingly, matching circuit 916 includes inductor $L_T$, which corresponds to a lumped-element series inductance of a length of, for example, a coaxial cable (e.g., 50-ohm) transmission line. Thus, the capacitance of capacitor $C_{ST}$ may be increased from $C_S$ of FIG. 6 to compensate for the presence of series inductor $L_T$. Additionally, capacitor $C_{PT}$ may be reduced to compensate for a series capacitance present in length of a coaxial cable (e.g., 50-ohm) transmission line. Capacitor $C_T$ corresponds to capacitor $C_T$ of FIG. 6, in which $C_T$ operates to raise the voltage at node B to a value above a reference potential, which may reduce voltage swings within conductive loops 920, 921, and 922. Although not shown in FIG. 9, adjustment of capacitors $C_{PT}$ and $C_{ST}$ may be performed by a controller, such as controller 290 of FIG. 2.

In particular embodiments, capacitors $C_{PT}$ and $C_{ST}$ may be adjusted to accommodate a transmission line length of about one-half wavelength ($\lambda/2$) of an operating frequency (e.g., $f_{OP}$), such as 13.5 MHz. In certain embodiments, computer simulations utilizing a transmission line of various length, which bring about corresponding delays (such as a delay of about 35.8 ns) in currents between RF current generator 114 and conductive loops 920, 921, and 922, have been shown to impact the operating frequency at which a maximum current can be induced to flow within the conductive loops. In an example, a transmission line having a length of one-half wavelength, which corresponds to a full rotation around the Smith chart, serves to bring about maximum current flow through conductive loop at a frequency slightly higher than a resonant frequency of a conductive loop.

Between nodes A and B of FIG. 9, conductive loops 920, 921, and 922 correspond to RF structures for forming an ionized plasma material. Presence of resistance (R) indicates that each of conductive loops 920, 921, and 922 operate in a plasma-forming state. Loop currents $I_{C1}$, $I_{C2}$, and $I_{C3}$ correspond to currents flowing within, for example, conductive loops 510 of FIG. 5. Inductors $L_{CL}$ correspond to inductances of each of loops 510 while plasma is being formed. Coupling factors $k_1$, $k_2$, and $k_3$ indicate a relationship between a loop current and current conduction through resistance (R), such as $I_{P1}$, $I_{P2}$, and $I_{P3}$. Thus, at least in particular embodiments, it may be desirable for a relatively strong relationship to exist between a loop current and current conduction through resistance (R). In certain embodiments, presence of a relatively large coupling factor, such as a coupling factor between about 0.35 and 0.45 coupling factor may serve to strengthen the negative feedback relationship between the increased plasma density and the capacitance exhibited by a resonant circuit.

In FIG. 9, a one-half wavelength transmission line is utilized to couple output node A, which corresponds to the output side of matching circuit 916, with each of conductive loops 920, 921, and 922. In particular embodiments, use of a one-half wavelength ($\lambda/2$) transmission line, such as a 50-ohm coaxial cable, introduces a one-half wavelength time delay in a current conducting from output node A to conductive loops 920, 921, and 922. In the embodiment of FIG. 9, such a time delay operates to provide uniformity in power coupled between matching circuit 916 and conductive loops 920, 921, and 922. Accordingly, even if varying line lengths, parasitic capacitances or inductances, bring about differing values for $L_{CL}$ and $C_{CL}$ of conductive loops 920, 921, and 922, a one-half wavelength transmission line can operate to bring about equal, or at least substantially equal, power coupling to each conductive loop.

Figure 10:
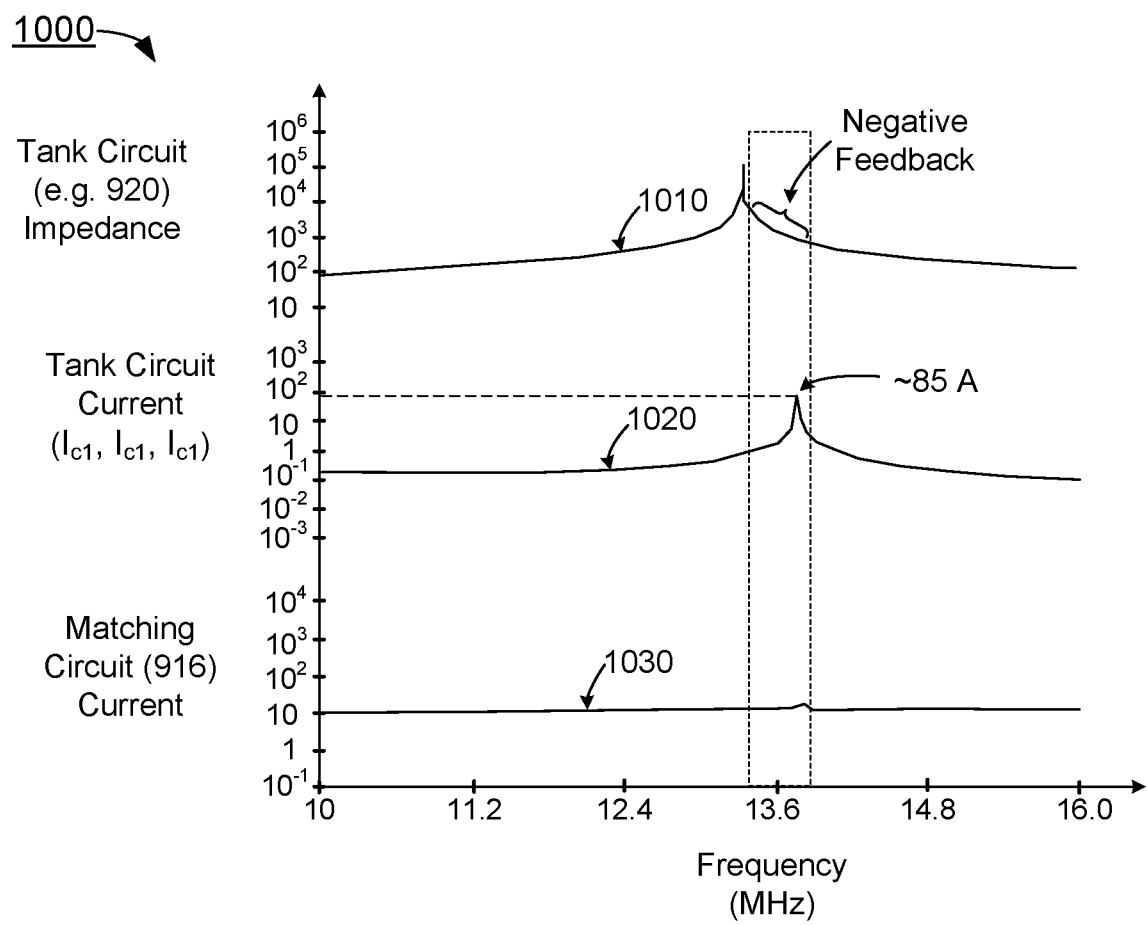
FIG. 10 shows a graph of tank circuit impedance, tank circuit current, and matching network current for a single hairpin-shaped conductive loop for forming an ionized plasma material, utilizing a common frequency scale, according to an embodiment.

FIG. 10 shows graphs of tank circuit impedance, tank circuit current, and matching network current for a single hairpin-shaped conductive loop for forming an ionized plasma material, utilizing a common frequency scale, according to an embodiment 1000. The graphs of FIG. 10 result from use of a coaxial cable transmission line that is about one-half wavelength of the operating frequency of 13.56 MHz. As mentioned with respect to FIG. 9, a one-half wavelength transmission line brings about maximum current flow through a conductive loop at a frequency at or near 13.56 MHz.

In the top portion of FIG. 10, graph 1010 shows monotonically increasing impedance of an example conductive loop, such has any one of conductive loops 920, 921, and 922. Graph 1010 indicates real impedance peaking at a resonant frequency of approximately 13.45 MHz, which corresponds to operation of a conductive loop/capacitor combination during plasma formation. When conductive loop 920, for example, is operated at a frequency that is slightly greater than the 13.45 MHz resonance frequency (e.g. 13.56 MHz), the conductive loop/capacitor combination operates in a negative feedback region. In the negative feedback region, impedance of the conductive loop/capacitor combination increases as the operating frequency becomes incrementally closer to the resonant frequency. For example, as depicted in graph 1010, operation of the conductive loop/capacitor combination at a frequency of slightly greater than 13.45 MHz indicates an impedance of 10,000 ohms or greater. However, as the operating point of the conductive loop/capacitor combination assumes a value slightly greater than 13.45 MHz (e.g., 13.56 MHz), the impedance assumes a value of about 1000 ohms or less. In particular embodiments, the negative feedback region may include a range of frequencies within about 10% of the resonant frequency of a conductive loop/capacitor combination. However, in other embodiments, the negative feedback region may include a broader range of frequencies, such as frequencies within about 15% or about 20% of the resonant frequency. In still other embodiments, the negative feedback region may include a narrower range of frequencies, such as frequencies within about 8%, 5%, or 2% of the resonant frequency.

FIG. 10 also depicts graph 1020, which corresponds to current conducted within any one of conductive loop 920, 921, and 922, each of which corresponds to a conductive loop/capacitor combination. As indicated at graph 1020, at a frequency of approximately 13.6 MHz, current conduction reaches a maximum of about 85 A. Such relatively high current flow may encourage plasma formation using a conductive loop. However, as indicated at graph 1030, current conduction through matching circuit 916 assumes a nominal value of about 10 A with a slight increase at approximately 13.6 MHz.

Although graph 1020 indicates a current conduction through a conductive loop of 85 A and a current conduction through matching circuit 916 comprises a value of about 10 A, indicating a current through conductive loop that is more than 8.5 times the current conduction through a matching network, the disclosed embodiments are not so limited. For example, in other embodiments, current conduction through a conductive loop may be, perhaps, only twice, three times, or four times that of the current conduction through a matching network. In still other embodiments, current conduction through a conductive loop may be greater than 8.5 times the current conduction through a matching network, such as 9 times, or 10 times, or may be related to current conduction through a matching network by an even larger factor.

Figure 11A:
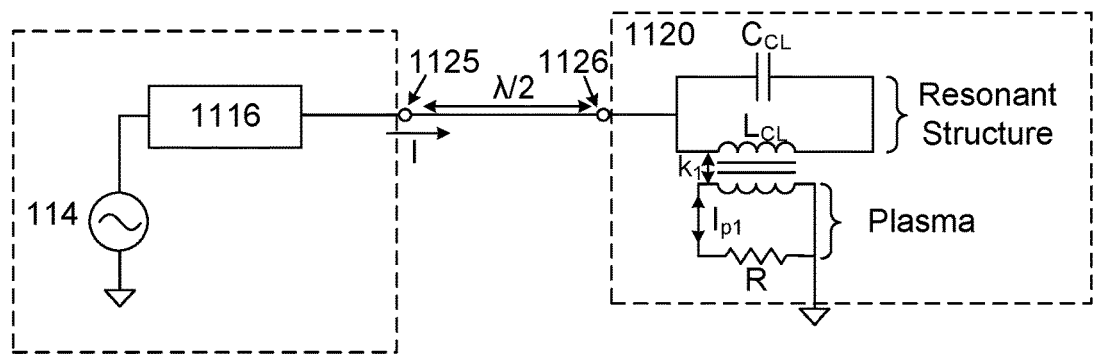
FIG. 11A shows an equivalent circuit of a resonant RF coupling structure coupled to an ionized plasma material, according to an embodiment.

FIG. 11A shows an equivalent circuit of a resonant RF coupling structure coupled to an ionized plasma material, according to an embodiment 1100. In the equivalent circuit of embodiment 1100, RF current generator 114 provides an RF current to matching network 1116. Matching network 1116 may include reactive components operating to match the output impedance of RF current generator 114. In the embodiment of FIG. 11A, RF current generator 114 and reactive components of matching network 1116 include a non-negligible real impedance (e.g., resistance) such that an increased current flow (I) through node 1125 brings about a decrease in the voltage present at node 1125. Equivalent circuit 1120 includes a resonant structure, which may be implemented as a hairpin-shaped conductive loop, for example. Responsive to current conduction within the resonant RF coupling structure of equivalent circuit 1120, a plasma may be formed. In equivalent circuit 1120, coupling between the resonant RF coupling structure and the plasma may be represented by the coupling factor $k_1$. Thus, an increase in the density of an ionized plasma material may be represented as an increase in coupling factor $k_1$. In particular embodiments, coupling factor $k_1$ may vary from between about 0.35 and about 0.45, for example. In some embodiments, coupling factor $k_1$ may assume different values, such as between about 0.25 and about 0.5.

In the embodiment of FIG. 11A, as the coupling factor ($k_1$) between the plasma and the resonant RF coupling structure of equivalent circuit 1120 increases, indicating an increase in plasma density, the impedance of equivalent circuit 1120 may decrease. Such a decrease in the impedance of equivalent circuit 1120, shown as $Z_{1120}\downarrow$ in FIG. 11A, may be brought about by increased current flow ($I_{P1}$) within the plasma of equivalent circuit 1120. Accordingly, current conduction through node 1125 may increase, as indicated by I↑ in FIG. 11A. However, as current conduction through node 1125 increases, the voltage at node 1125 is reduced in response to increased resistive losses through matching network 1116. Such reduction in voltage at node 1125 is indicated as $V_{1251}\downarrow$, in FIG. 11A. Consequently, as indicated as I↓ current delivered to equivalent circuit 1120 is reduced. In some embodiments, such a reduction in the current delivered to equivalent circuit 1120 returns the delivered current to a nominal or steady-state value. Responsive to reducing the current delivered to equivalent circuit 1120 to a nominal or steady-state value, coupling between the resonant RF coupling structure and the plasma may be decreased, thereby increasing the impedance of equivalent circuit 1120. Such an increase in the impedance of equivalent circuit 1120, along with the attendant decrease in current delivered to the equivalent circuit, may return the voltage of output node 1125 to a steady-state value.

In the embodiment of FIG. 11A, node 1125 is separated from input node 1126 by a transmission line length corresponding to one half of the wavelength of an RF signal in the transmission line medium. A half-wavelength transmission line may be utilized to transform impedances of the resonant structure. Such impedance transformation may provide additional control over the impedance of equivalent circuit 1120 as reflected at node 1125.

Figure 11B:
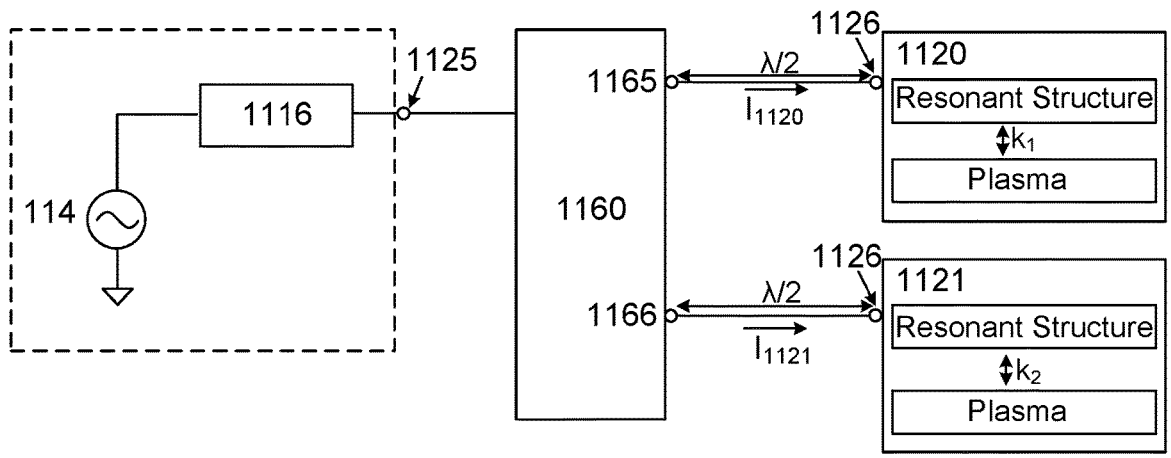
FIG. 11B shows equivalent circuits of resonant RF coupling structures coupled an ionized plasma material, according to an embodiment.

FIG. 11B shows equivalent circuits of resonant RF coupling structures coupled an ionized plasma material, according to an embodiment 1150. In the embodiment of FIG. 11B, equivalent circuit 1121 is arranged in parallel with equivalent circuit 1120 (of FIG. 11A). Power divider 1160 operates to divide power generated by RF current generator 114 into approximately equal portions. In this context, approximately equal portions refers to portions within 5% of one another. Power divider 1160 exhibits a real impedance (e.g., resistance) in which an increased current flow brings about a decrease in the voltage present at nodes 1165 and 1166. Equivalent circuit 1121 may operate in a manner similar to that of equivalent circuit 1120, in which power may be coupled from a resonant RF coupling structure to a plasma. A coupling factor, such as $k_2$, may indicate a level of coupling between the resonant RF coupling structure and the plasma.

In the embodiment of FIG. 11B, as the coupling factor ($k_1$) between the plasma and the resonant RF coupling structure of equivalent circuit 1120 increases, the impedance of equivalent circuit 1120 may decrease. Such a decrease in the impedance of equivalent circuit 1120, shown as $Z_{1120}\downarrow$ in FIG. 11B, may be brought about by increased current flow within the plasma of equivalent circuit 1120. Accordingly, current conduction through node 1165 of power divider 1160 may increase, as indicated by $I_{1120}\downarrow$ in FIG. 11A. However, as current conduction through node 1165 increases, the voltage at node 1165 is reduced in response to increased resistive losses within power divider 1160. Such reduction in voltage at node 1165 is indicated as $V_{1165}\downarrow$ in FIG. 11B. Consequently, as indicated as $I_{1120}\downarrow$, current delivered to equivalent circuit 1120 is reduced. Responsive to reducing the current delivered to equivalent circuit 1120 to a nominal or steady-state value, coupling between the resonant RF coupling structure and the plasma may be decreased, thereby increasing the impedance of equivalent circuit 1120. Such an increase in the impedance of equivalent circuit 1120, along with the attendant decrease in current delivered to the equivalent circuit, may return the voltage of output node 1125 to a steady-state value.

In some embodiments, such a reduction in the current delivered to equivalent circuit 1120 returns the delivered current to a nominal or steady-state value. In the embodiment of FIG. 11A, node 1165 and input node 1126 to equivalent circuit 1120 are separated by a transmission line length corresponding to one half of the wavelength of an RF signal in the transmission line medium. A half-wavelength transmission line may be utilized to transform impedances of the resonant structure.

Equivalent circuit 1121 operates in a manner similar to equivalent circuit 1120. Such operation involves an increase in coupling between the resonant RF coupling structure of equivalent circuit 1121 and a plasma of the equivalent circuit. The increase in coupling brings about a decrease in impedance presented by equivalent circuit 1121 ($Z_{1121}\downarrow$). Consequently, an increased current ($I_{1121}\downarrow$) may be conducted from output node 1166 which, in turn, operates to reduce the voltage at output node 1166 ($V_{1166}\downarrow$). Responsive to a reduction in the voltage at output node 1166, the output current conducted from power divider 1160 to equivalent circuit 1121 is reduced to a nominal value.

Figure 12:
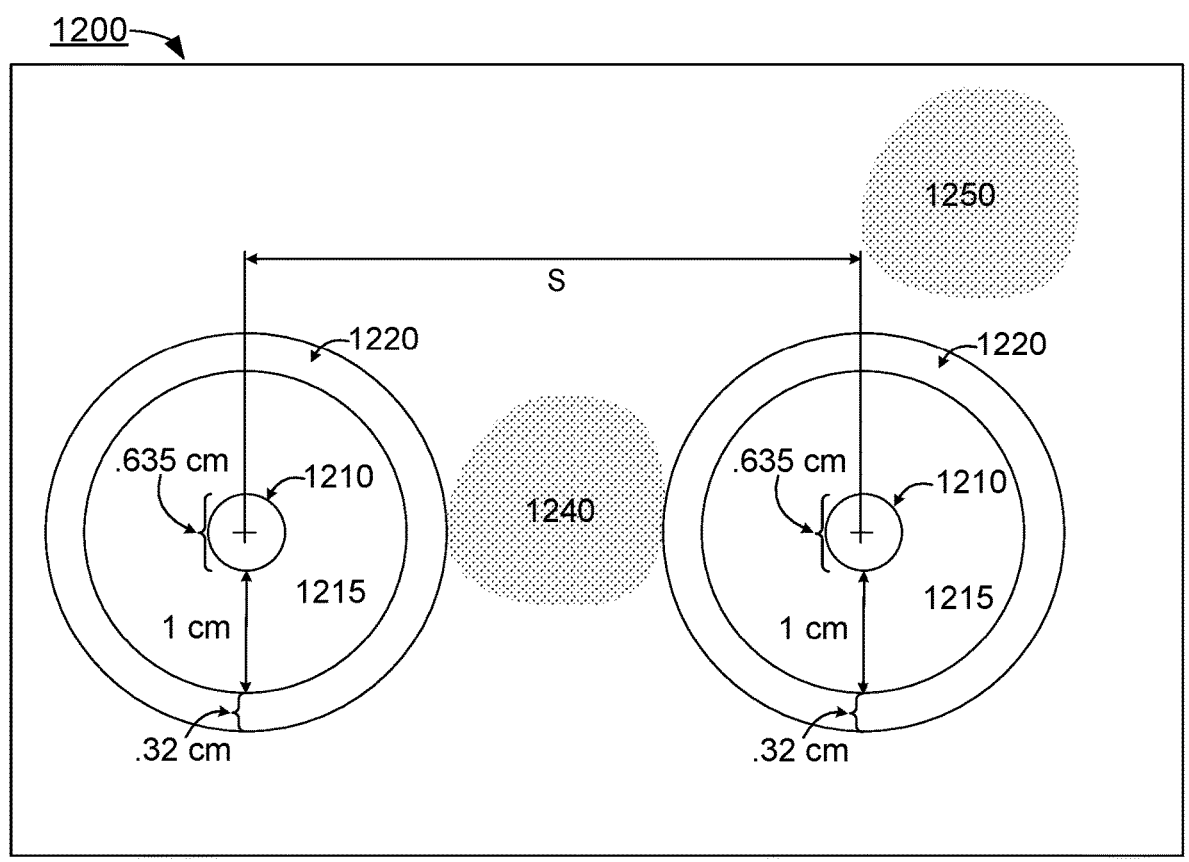
FIG. 12 shows a side view of conductors of a conductive loop immersed within an ionized plasma material, according to an embodiment.

FIG. 12 shows a side view of conductors of a conductive loop immersed within an ionized plasma material, according to an embodiment 1200. Conductors 1210 of FIG. 12 conduct current in opposite directions similar to current conduction (I) in conductive loop 310 of FIG. 3. In the embodiment of FIG. 12, conductors 1210 each comprise a thickness of about 0.635 cm (about ¼ inch). Conductors 1210 are surrounded by air gap 1215, which comprises a thickness of about 1 cm (about 0.4 inch). Conductors 1210 and air gap 1215 are surrounded by ceramic tube 1220, which comprises a thickness of about 0.32 cm (about 0.125 inch).

Responsive to current conduction in opposite directions through conductors 1210, similar to current conduction (I) in conductive loop 310 of FIG. 3, a magnetic field between conductors 1210, such as at region 1240, may assume a relatively high value. Accordingly, a relatively dense plasma may form at region 1240. However, at region 1250, which corresponds to a region away from region 1240, a less dense plasma may form. In particular embodiments, immersion of a plasma-forming conductive loop, such as shown in FIG. 12, may result in a coupling factor greater than a coupling factor provided by other arrangements of a conductive loop. For example, the arrangement of conductors in FIG. 12 may provide a coupling factor of between 0.35 and 0.5 (e.g., about 0.4), which may represent increased coupling over the conductive loop arrangement of, for example, FIG. 3 and FIG. 4.

Returning now to FIG. 2, in general controller 290 may be defined as electronics having various integrated circuits, logic, memory, and/or software that receive instructions, issue instructions, control operation, enable cleaning operations, enable endpoint measurements, and the like. The integrated circuits may include chips in the form of firmware that store program instructions, digital signal processors (DSPs), chips defined as application specific integrated circuits (ASICs), and/or one or more microprocessors, or microcontrollers or field-programmable gate arrays (FPGA) or FPGA with system-on-a-chip (SoC) that that execute program instructions (e.g., software). Program instructions may be instructions communicated to the controller in the form of various individual settings (or program files), defining operational parameters for carrying out a particular process on or for a semiconductor wafer or to a system. The operational parameters may, in some implementations, be part of a recipe defined by process engineers to accomplish one or more processing steps during the fabrication of one or more layers, materials, metals, oxides, silicon, silicon dioxide, surfaces, circuits, and/or dies of a wafer.

The controller, in some embodiments, may be a part of or coupled to a computer that is integrated with, coupled to the system, otherwise networked to the system, or a combination thereof. For example, the controller may be in the "cloud" or all or a part of a fab host computer system, which can allow for remote access of the wafer processing. The computer may enable remote access to the system to monitor current progress of fabrication operations, examine a history of past fabrication operations, examine trends or performance metrics from a plurality of fabrication operations, to change parameters of current processing, to set processing steps to follow a current processing, or to start a new process. In some examples, a remote computer (e.g. a server) can provide process recipes to a system over a network, which may include a local network or the Internet. The remote computer may include a user interface that enables entry or programming of parameters and/or settings, which are then communicated to the system from the remote computer. In some examples, the controller receives instructions in the form of data, which specify parameters for each of the processing steps to be performed during one or more operations. It should be understood that the parameters may be specific to the type of process to be performed and the type of tool that the controller is configured to interface with or control. Thus, as described above, the controller may be distributed, such as by comprising one or more discrete controllers that are networked together and working towards a common purpose, such as the processes and controls described herein. An example of a distributed controller for such purposes would be one or more integrated circuits on a chamber in communication with one or more integrated circuits located remotely (such as at the platform level or as part of a remote computer) that combine to control a process on the chamber.

In the foregoing detailed description, numerous specific details are set forth to provide a thorough understanding of the presented embodiments or implementations. The disclosed embodiments or implementations may be practiced without some or all of these specific details. In other instances, well-known process operations have not been described in detail so as to not unnecessarily obscure the disclosed embodiments or implementations. While the disclosed embodiments or implementations are described in conjunction with the specific embodiments or implementations, it will be understood that such description is not intended to limit the disclosed embodiments or implementations.

The foregoing detailed description is directed to certain embodiments or implementations for the purposes of describing the disclosed aspects. However, the teachings herein can be applied and implemented in a multitude of different ways. In the foregoing detailed description, references are made to the accompanying drawings. Although the disclosed embodiments or implementation are described in sufficient detail to enable one skilled in the art to practice the embodiments or implementations, it is to be understood that these examples are not limiting; other embodiments or implementation may be used and changes may be made to the disclosed embodiments or implementation without departing from their spirit and scope. Additionally, it should be understood that the conjunction "or" is intended herein in the inclusive sense where appropriate unless otherwise indicated; for example, the phrase "A, B, or C" is intended to include the possibilities of "A," "B," "C," "A and B," "B and C," "A and C," and "A, B, and C."

In this application, the terms "semiconductor wafer," "wafer," "substrate," "wafer substrate," and "partially fabricated integrated circuit" are used interchangeably. One of ordinary skill in the art would understand that the term "partially fabricated integrated circuit" can refer to a silicon wafer during any of many stages of integrated circuit fabrication thereon. A wafer or substrate used in the semiconductor device industry may include a diameter of 200 mm, or 300 mm, or 450 mm. The foregoing detailed description assumes embodiments or implementations are implemented on a wafer, or in connection with processes associated with forming or fabricating a wafer. However, disclosed embodiments are not limited to such. The work piece may be of various shapes, sizes, and materials. In addition to semiconductor wafers, other work pieces that may take advantage of claimed subject matter and may include various articles such as printed circuit boards, or the fabrication of printed circuit boards, and the like.

Unless the context of this disclosure clearly requires otherwise, throughout the description and the claims, the words "comprise," "comprising," and the like are to be construed in an inclusive sense as opposed to an exclusive or exhaustive sense; that is to say, in a sense of "including, but not limited to." Words using the singular or plural number also generally include the plural or singular number respectively. When the word "or" is used in reference to a list of 2 or more items, that word covers all of the following interpretations of the word: any of the items in the list, all of the items in the list, and any combination of the items in the list. The term "implementation" refers to implementations of techniques and methods described herein, as well as to physical objects that embody the structures and/or incorporate the techniques and/or methods described herein.

What is claimed is:

1. An apparatus for forming a plasma, comprising:
   one or more coupling ports configured to accept a radiofrequency (RF) current;
   one or more conductive loops configured to permit the RF current to conduct from at least a first port of the one or more coupling ports to at least a second port of the one or more coupling ports, the one or more conductive loops each configured to exhibit a first value of inductance in an absence of the plasma and to exhibit a second value of inductance in a presence of the plasma; and
   one or more reactive elements, each coupled to a corresponding one of the one or more conductive loops, to form a corresponding number of coupling structures, each coupling structure having a resonant frequency configured to increase in response to the presence of the plasma, the plasma at least partially surrounding the one or more conductive loops.

2. The apparatus of claim 1, wherein the one or more conductive loops are configured to form a plasma operating in an inductive mode.

3. The apparatus of claim 1, wherein the one or more conductive loops comprises two or more conductive loops.

4. The apparatus of claim 1, wherein each of the one or more reactive elements comprises one or more capacitive elements that cooperate with a corresponding conductive loop of the one or more conductive loops to cause resonance at a frequency that is lower than the frequency of the RF current.

5. The apparatus of claim 4, wherein the resonant frequency is a value that is within 10% of the frequency of the RF current.

6. The apparatus of claim 4, wherein the forming of the plasma causes a second value of inductance that is less than the first value of inductance.

7. The apparatus of claim 1, wherein a coupling factor between the one or more conductive loops and the formed plasma comprises a value of between 0.35 and about 0.5.

8. The apparatus of claim 7, wherein at least a portion of the formed plasma is located in a region between segments of each of the one or more conductive loops.

9. The apparatus of claim 7, wherein at least a portion of the formed plasma is located in a region less than twice a separation distance between adjacent segments of each of the one or more conductive loops.

10. The apparatus of claim 1, wherein at least one of the one or more conductive loops comprises a hairpin shape.

11. The apparatus of claim 1, further comprising a delay network configured to maintain current conduction within the one or more conductive loops at a value that is at least twice the value of the RF current conducted to the first port of the one or more coupling ports.

12. The apparatus of claim 11, wherein the delay network is further configured to introduce a delay of one-half wavelength between an output port of an RF matching network and the first port of the one or more coupling ports.

13. An apparatus, comprising:
   one or more input ports to receive an RF current having an RF current frequency;
   one or more conductive loops coupled to a corresponding one of the one or more input ports, each of the one or more conductive loops configured to exhibit inductance; and
   one or more capacitive elements, each of the one or more capacitive elements coupled to a corresponding one of the one or more conductive loops so as to resonate at a first frequency that is below the RF current frequency, the one or more conductive loops configured to convert a gas, at least partially surrounding the one or more conductive loops, to a plasma in response to conduction of the RF current.

14. The apparatus of claim 13, wherein the first frequency differs from the RF current frequency by less than 10%.

15. The apparatus of claim 13, wherein the gas at least partially surrounds the one or more conductive loops.

16. The apparatus of claim 13, wherein the gas is located within a distance of two times a spacing between adjacent segments of the one or more conductive loops.

17. The apparatus of claim 13, wherein the one or more conductive loops are configured to resonate at a frequency below about 13.56 MHz.

18. The apparatus of claim 13, wherein at least one of the one or more conductive loops comprises a hairpin shape.

19. The apparatus of claim 13, further comprising a time-delay network configured to maintain peak current conduction within the one or more conductive loops at a value that is at least twice the value of the RF current conducted a first input port of the one or more input ports.

20. A multi-station integrated circuit fabrication chamber, comprising:
a matching network to receive an RF current from an output port of an RF current generator;
one or more coupling structures to receive a current from the matching network, the one or more coupling structures having at least one conductive loop and at least one capacitive element, the one or more coupling structures configured to resonate at a resonant frequency that is less than the frequency of the RF current; and
a volume configured to permit conversion of one or more gases into a plasma at least partially surrounding the one or more coupling structures to conduct one or more fabrication operations within the multi-station integrated circuit fabrication chamber.

21. The multi-station integrated circuit fabrication chamber of claim 20, further comprising a time-delay network configured to maintain peak current conduction within the one or more conductive loops at a value that is at least twice a value of the RF current received from the matching network.

22. The multi-station integrated circuit fabrication chamber of claim 20, further comprising a time-delay network configured to introduce a delay of one-half wavelength between an output port of the matching network and input ports of the one or more coupling structures.

23. The multi-station integrated circuit fabrication chamber of claim 20, wherein the one or more gases at least partially surround the one or more conductive loops.

24. The multi-station integrated circuit fabrication chamber of claim 20, wherein at least a portion of the one or more gases are located within a distance of two times a spacing between adjacent segments of the one or more conductive loops.

25. The multi-station integrated circuit fabrication chamber of claim 20, wherein a coupling factor between the one or more conductive loops and the plasma comprises a value of between about 0.2 and about 0.5.

26. The multi-station integrated circuit fabrication chamber of claim 20, wherein a first frequency of the RF current and the resonant frequency differ by less than 10%.

27. The multi-station integrated circuit fabrication chamber of claim 20, wherein the one or more coupling structures comprises three or more coupling structures.

28. A system for forming a plasma, comprising:
a radiofrequency (RF) current generator; and
a first RF coupling structure configured to receive power generated by the RF current generator and to convert a gaseous material, at least partially surrounding the first RF coupling structure, to an ionized plasma, the first RF coupling structure configured to exhibit an impedance that decreases responsive to an increased density of the ionized plasma, the RF current generator configured to decrease output current delivered to the first RF coupling structure responsive to the decreased impedance.

29. The system of claim 28, further comprising:
a second RF coupling structure, the second RF coupling structure configured to receive a current conducted from the RF current generator and to convert a gaseous material, at least partially surrounding the second RF coupling structure, to an ionized plasma; and
an RF power divider having an input port coupled to an output port of the RF current generator and having a first output port coupled to the first RF coupling structure and a second output port coupled to the second RF coupling structure, the second RF coupling structure configured to exhibit an impedance that decreases responsive to an increased density of the ionized plasma.

30. The system of claim 29, wherein power delivered to the first RF coupling structure by the RF power divider and the power delivered to the second RF coupling structure by the RF power divider are configured to be approximately equal during the increased density of the ionized plasma converted by the first RF coupling structure and during the increased density of the ionized plasma converted by the second RF coupling structure.

31. The system of claim 29, wherein the first RF coupling structure and the second RF coupling structure comprise a conductive loop configured to form the ionized plasma in an H mode.

* * * * *